(12) United States Patent
Paul et al.

(10) Patent No.: US 7,309,563 B2
(45) Date of Patent: Dec. 18, 2007

(54) PATTERNING USING WAX PRINTING AND LIFT OFF

(75) Inventors: Kateri E. Paul, Everett, MA (US); William S. Wong, San Carlos, CA (US); Steven E. Ready, Santa Cruz, CA (US); René A. Lujan, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 594 days.

(21) Appl. No.: 10/741,252

(22) Filed: Dec. 19, 2003

(65) Prior Publication Data

US 2005/0136358 A1 Jun. 23, 2005

(51) Int. Cl.
*G03C 5/00* (2006.01)

(52) U.S. Cl. ............... 430/322; 430/313; 430/311

(58) Field of Classification Search .............. None
See application file for complete search history.

(56) References Cited

U.S. PATENT DOCUMENTS 6,890,050 B2* 5/2005 Ready et al. ............. 347/19
6,972,261 B2* 12/2005 Wong et al. ............. 438/706
2002/0054197 A1* 5/2002 Okada et al. ............. 347/101
2006/0105492 A1* 5/2006 Veres et al. ............. 438/99

FOREIGN PATENT DOCUMENTS

DE 003635770 * 4/1988

* cited by examiner

*Primary Examiner*—John A. McPherson
*Assistant Examiner*—Daborah Chacko-Davis
(74) *Attorney, Agent, or Firm*—Bever, Hoffman & Harms, LLP; Patrick T. Bever

(57) ABSTRACT

A method for performing a liftoff operation involves printing a liftoff pattern using low-resolution patterning techniques to form fine feature patterns. The resulting feature size is defined by the spacing between printed patterns rather than the printed pattern size. By controlling the cross-sectional profile of the printed liftoff pattern, mask structures may be formed from the liftoff operation having beneficial etch-mask aperture profiles. For example, a multi-layer printed liftoff pattern can be used to create converging aperture profiles in a patterned layer. The patterned layer can then be used as an etch mask, where the converging aperture profiles result in desirable diverging etched features.

9 Claims, 20 Drawing Sheets

PATTERNING USING WAX PRINTING AND LIFT OFF

This invention was made with Government support under 70NANBOH3033 awarded by NIST/ATP. The Government has certain rights in this invention.

BACKGROUND OF THE INVENTION

1. Field of the Invention

Further, the invention relates generally to electronic materials processing, and more particularly to a system and method for performing a patterning process without using photolithography.

2. Related Art

Modern video and computer LCD (liquid crystal display) displays typically include large arrays of thin film transistors (TFTs) for addressing the individual pixels in the displays. As the demand for larger LCD displays continues to rise, the TFT arrays used in those LCD displays must include increasing numbers of TFTs and more complex interconnect structures. In addition, the need for large display areas complicates the fabrication of these devices using conventional semiconductor processes. In combination, these factors result in ever-increasing TFT array size and complexity.

To reduce some of the costs associated with the production of these larger LCD displays, a liftoff process is sometimes used to generate the patterned layers that make up the TFT array. In a conventional liftoff process, a base layer on which a patterned photoresist layer is formed is blanket-coated with an overlying thin film, typically a metal layer. Then, the patterned photoresist layer is stripped, which removes those portions of the metal layer formed on top of the patterned photoresist layer, leaving a patterned metal layer on the base layer. This process is illustrated in FIGS. 1A-1F.

FIG. 1A shows a substrate 110 on which a photoresist layer 120 has been formed. In FIG. 1B, a lithography operation using a photomask 130 to expose a portion 121 of photoresist layer 120. Then, in FIG. 1C, a surface treatment operation is performed on photoresist layer 120 to create a surface 121 that develops more slowly than the underlying portion of photoresist layer 120. Note that this surface treatment may alternatively be performed before the exposure step shown in FIG. 1B.

In FIG. 1D, the unexposed portions of photoresist layer 120 are stripped from substrate 110, leaving a photoresist feature 121A (corresponding to portion 121 in FIG. 1B). Because treated surface 122 shown in FIG. 1C develops at a slower rate than the underlying portions of photoresist layer 120, the top of developed photoresist feature 121A overhangs the sidewalls of photoresist feature 121A, thereby creating the undercut profile shown in FIG. 1D.

Next, in FIG. 1E, a metal layer 130 is blanket deposited over substrate 110 and photoresist feature 121A. A photoresist strip operation is then performed to dissolve patterned photoresist feature 121A. The overhang region of patterned photoresist feature 121A results in thinned or even uncoated attack points 131 and 132 that allow the photoresist stripper to reach patterned photoresist feature 121A (in the case of the thinned attack points 131 and 132, the photoresist stripper can penetrate metal layer 130 through naturally occurring pinholes). When patterned photoresist feature 121A is stripped, the portion of metal layer 130 formed over resist feature 121A is lifted off substrate 110, resulting in a patterned metal layer 130A, as shown in FIG. 1F.

By eliminating the need for a separate etch process to create patterned metal layer 130A (in FIG. 1F), the conventional (photoresist-based) liftoff process described with respect to FIGS. 1A-1F can simplify the overall production process, thereby reducing production costs. However, patterning photoresist layer 120 (in FIG. 1B) still requires a photolithography process. For cost-reduction purposes, it is generally desirable to minimize the number of photolithography process steps required. This is not only due to the demanding nature of the photolithography process itself, but also due to the time and costs involved in producing the delicate photomasks used in the photolithography process.

Accordingly, it is desirable to provide a system and method for performing a liftoff process that does not require photolithography.

SUMMARY OF THE INVENTION

The invention is directed towards printing systems and methods that can perform liftoff processing by using printed liftoff patterns. By printing the liftoff pattern, the complex photolithography steps can be eliminated from the liftoff process, thereby reducing production costs and simplifying the patterning process.

According to an embodiment of the invention, a liftoff pattern is printed on a base layer, such as a semiconductor layer, glass, or plastic. A liftoff layer (such as gold, chromium, or aluminum) is then blanket deposited over the base layer (and the liftoff pattern). According to an embodiment of the invention, an oxygen plasma clean can be performed prior to the blanket deposition to improve adherence of the patterning layer to the base layer. Then, when the liftoff pattern is removed, the overlying portions of the liftoff layer are removed as well, thereby creating a patterned liftoff layer. This patterned liftoff layer can be used as actual device structure (e.g., contact pads, interconnects) or as a mask for processing of underlying layers.

Because a printing operation for a liftoff pattern is much less sensitive to environmental factors, the use of a printed liftoff pattern beneficially allows the liftoff process to be carried out in a lab environment, rather than in a cleanroom, which further reduces the cost of production. In addition, a liftoff pattern can be printed on non-planar surfaces, unlike photolithography, which requires a very flat surface to maintain pattern fidelity.

The printing of a liftoff pattern also simplifies the alignment of that liftoff pattern with underlying elements, since photomask handling is eliminated completely. This is particularly beneficial when creating low coverage liftoff patterns (i.e., liftoff patterns that only affect a small portion of the overall patterned area, such as via masks), since the photomasks required for such low coverage patterns are mostly opaque, and are therefore difficult to align with underlying elements.

According to another embodiment of the invention, a liftoff pattern can be created by printing multiple layers for some or all of the elements making up the liftoff pattern. Due to the scalloped sidewall profile of those multi-layer elements, a liftoff operation using the printed liftoff pattern will create apertures in the patterned liftoff layer that exhibit a diverging profile (i.e., the width of the aperture increases with depth). The patterned liftoff layer can then be used as an etch mask for an underlying layer. Because of the diverging profile of the apertures in the patterned liftoff layer, the etched portions of the underlying layer will exhibit a converging profile (i.e., the width of the etched aperture decreases with depth). The converging etched aperture profiles beneficially minimize void formation during a subsequent fill operation (e.g., via plug or trench fill).

According to another embodiment of the invention, the liftoff pattern layout can be separated into discrete design layers having only parallel layout features, and the printed liftoff pattern can be formed by a series of printing operations, wherein the print direction of each printing operation is aligned with the parallel layout features of the design layer being printed. In this manner, the printing of multi-pass features can be avoided, and homogenous, smooth-edged printed patterns can be printed.

According to another embodiment of the invention, a printed liftoff pattern can be aligned with existing elements in the base layer (and any underlying layers) through the use of alignment marks on the base layer. By calibrating the liftoff pattern printing system against those alignment marks prior to printing the liftoff pattern, alignment between the liftoff pattern and elements on other layers (and within the liftoff pattern itself if the liftoff pattern is separated into different design layers) can be maintained.

BRIEF DESCRIPTION OF THE DRAWINGS

These and other features, aspects and advantages of the present invention will become better understood with regard to the following description, appended claims, and accompanying drawings, where:

DETAILED DESCRIPTION

Printing of integrated circuit (IC) patterns is an emerging technology that attempts to reduce the costs associated with IC production by printing an IC pattern directly on a substrate rather than creating the pattern using the delicate and time-consuming photolithography processes used in conventional IC manufacturing. As described in co-owned, co-pending U.S. patent application Ser. No. [XC-030], the printed IC pattern typically comprises actual IC features (i.e., elements that will be incorporated into the final IC, such as the gates and source and drain regions of thin film transistors, signal lines, opto-electronic device components, etc.) or a mask for subsequent semiconductor processing (e.g., etch, implant, etc.).

The invention adapts pattern printing to create a liftoff pattern for use in a liftoff process, thereby providing an alternative to the costly and sensitive photolithography operations used in conventional liftoff processes. According to various embodiments of the invention, the printing process for the liftoff pattern can be adjusted to improve overall manufacturing quality and performance.

Liftoff Pattern Printing Methodology

Figure 1A:
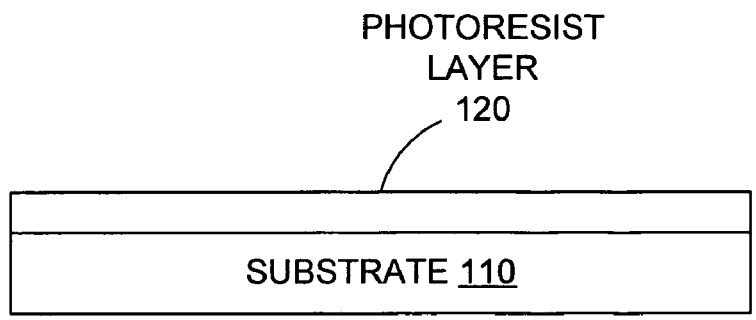
FIGS. 1A, 1B, 1C, 1D, 1E, and 1F are stages in a conventional lithography-based liftoff process.
Figure 1B:
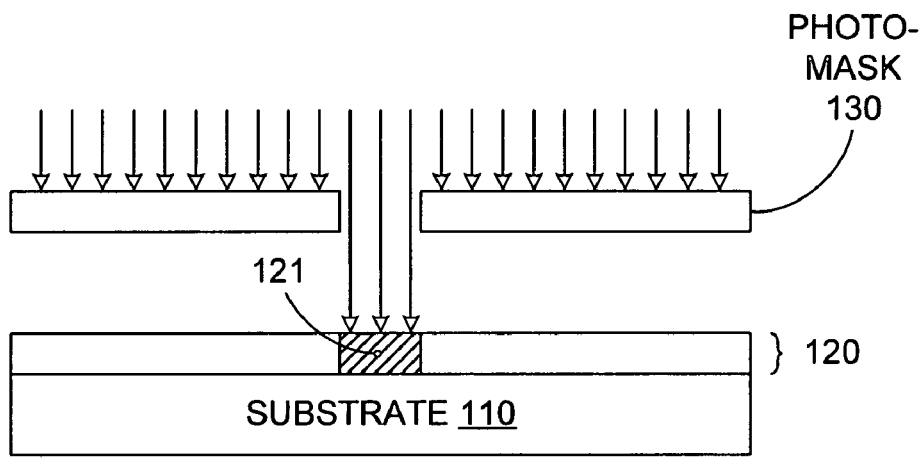
Figure 1C:
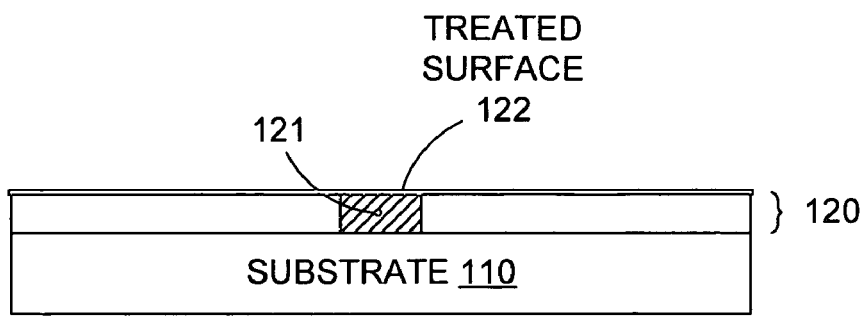
Figure 1D:
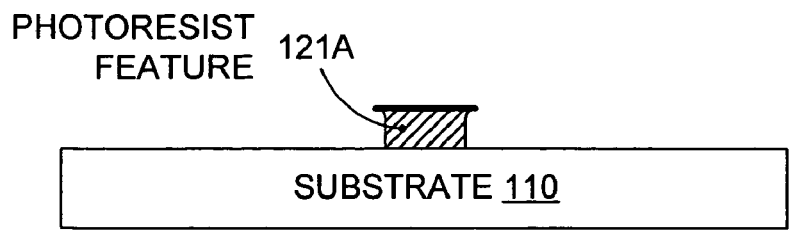
Figure 1E:
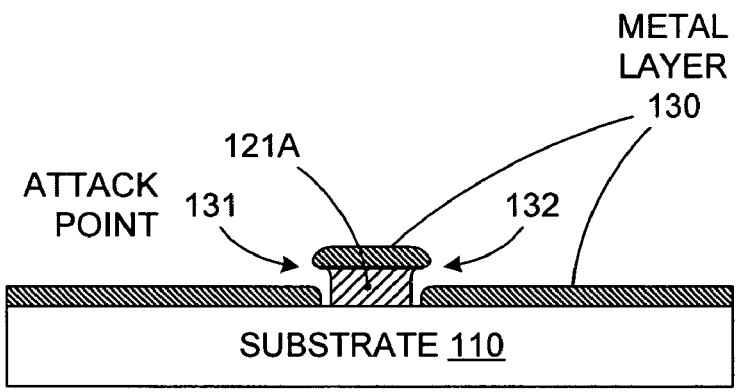
Figure 1F:
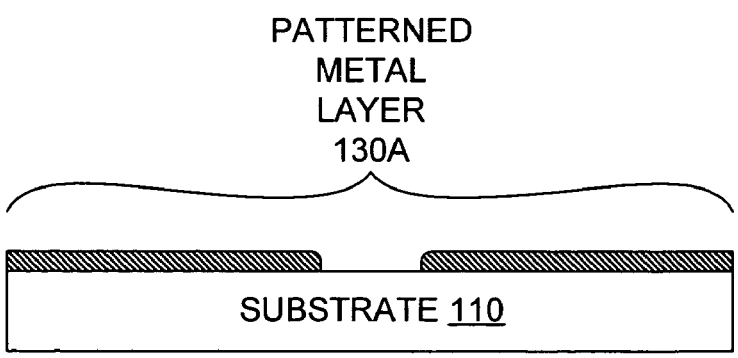
Figure 2A:
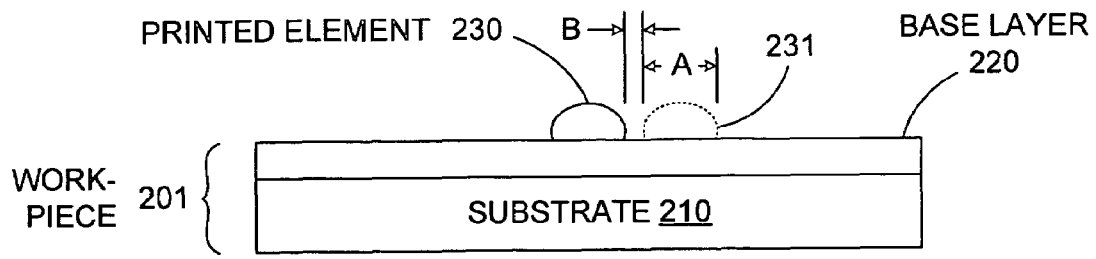
FIGS. 2A, 2B, 2C, 2D, 2E, 2F, 2G, and 2H are stage in a printing-based liftoff process, in accordance with an embodiment of the invention.

FIGS. 2A-2H depict a liftoff process using pattern printing, according to an embodiment of the invention. In FIG. 2A, a printed element 230 is deposited onto a base layer 220 of a workpiece 201. According to various embodiments of the invention, printed element 230 can be deposited via jet printing, screen printing, gravure, off-set printing, and xerography, among others.

Note that while base layer 220 is depicted as a layer on a substrate 210 for exemplary purposes, according to another embodiment of the invention, workpiece 201 could consist of only base layer 220. Note further that while base layer 220 is depicted as a single layer for clarity, according to various other embodiments of the invention, base layer 220 could comprise any number of layers. Similarly, while substrate 210 is depicted as a single layer for clarity, according to various other embodiments of the invention, substrate 210 can comprise any number of layers and can include any type of device or structure within those layers.

Depending on the type and intended use of the liftoff pattern, the printing fluid used to form printed element 230 can comprise a variety of materials, including phase-change materials (e.g., wax, photoresist, and epoxies) and colloidal suspensions (e.g., solution-processable electronic (i.e., conducting, semiconducting, or dielectric materials). Meanwhile, base layer 220 can comprise any material on which the liftoff pattern can be printed, such as a semiconductor material, a glass plate, or even flexible materials such as fabric or plastics.

Printed element 230 is formed when an ejector of a print head (not shown) ejects printing fluid onto base layer 220. The printing fluid attaches itself to base layer 220 through a wetting action and proceeds to solidify in place in a rounded cross-sectional profile. The specific size and shape of this profile is guided by competing processes of solidification and wetting. In the case of printing phase-change materials, solidification occurs when the printed drop loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the printing fluid and substrate, along with the ambient atmospheric conditions, determine the specific rate at which the deposited printing fluid transforms from a liquid to a solid.

Note that according to an embodiment of the invention, closely spaced printed elements can be used to create liftoff pattern features that are much smaller than the minimum printed element dimensions. For example, a second printed element 231 (indicated by the dotted line) could be printed next to printed element 230. Printed elements 230 and 231 have a minimum width A, but are spaced (edge to edge) by a distance B, which is smaller than width A. In this manner, a liftoff pattern that includes a feature having width B can be formed using printed elements 230 and 231 (which have minimum widths greater than width B).

Figure 2B:
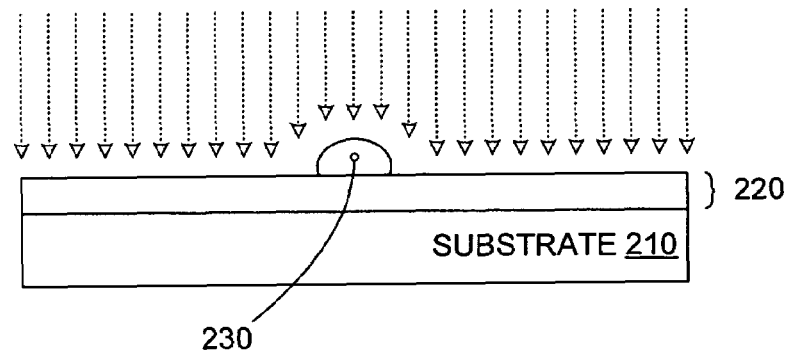

In FIG. 2B, an optional surface treatment is performed on baselayer 220. The surface treatment (such as a clean operation) can improve the bonding between base layer 220 and a subsequently deposited liftoff layer (described in greater detail below with respect to FIG. 2C), thereby improving the conditions for the eventual liftoff operation. According to an embodiment of the invention, the surface treatment can comprise exposing base layer 220 to a plasma (e.g., an oxygen plasma) at room temperature for 30 to 120 seconds.

Figure 2C:
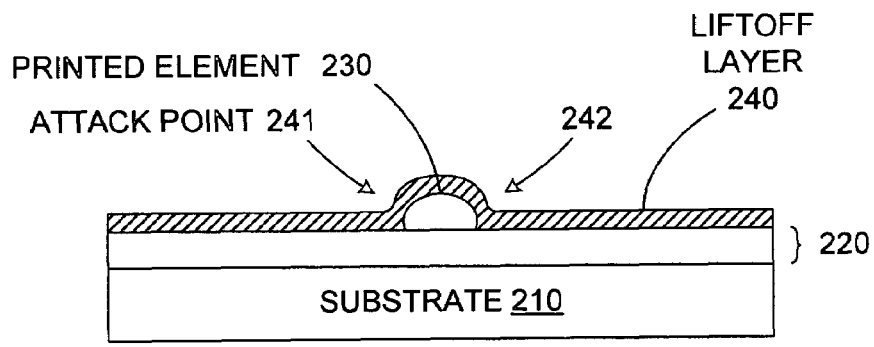
Figure 2D:
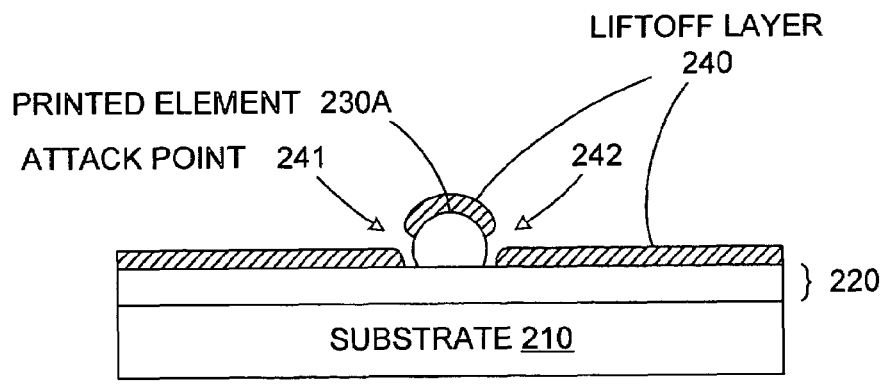

Then, in FIG. 2C, a liftoff layer 240 is blanket-deposited over base layer 220 and printed element 230. Because of the rounded profile of printed element 230, liftoff layer 240 includes attack points 241 and 242 around printed element 230. Attack points 241 and 242 are relatively thin compared to the rest of liftoff layer 240, and therefore allow a solvent to penetrate liftoff layer 240 and attack printed element 230 during a subsequent strip operation. Note that liftoff layer 240 itself can comprise any material that is not significantly affected by the solvent used to strip printed element 230. For example, if printed element 230 comprises a wax element, liftoff layer 240 could comprise a metal layer (e.g., gold, chromium, or aluminum), an oxide layer, or a semiconductor layer, among others.

Note further that the degree of thinning at attack points 241 and 242 depends to a large degree on the profile of printed element 230. The greater the thinning, the more effectively the strip operation can attack printed element 230, and the more reliably the liftoff operation can be performed. According to an embodiment of the invention, the printing operation parameters (e.g., printing material, printing speed) can be adjusted such that the printed element profile causes actual gaps to be formed in liftoff layer 240. For example, FIG. 2D, a highly rounded printed element 230A results in attack points 241 and 242 in liftoff layer 240 that fully expose the base of printed element 230A.

After liftoff layer 240 is formed, a strip (liftoff) operation is performed to remove printed element 230 and any portions of liftoff layer 240 that overlie printed element 230. Any solvent can be used that attacks printed element 230 without significantly affecting liftoff layer 240. For example, if printed element 230 is a wax element and liftoff layer 240 comprises a metal layer, tetrahydrofuran or toluene could be used as a solvent during the strip operation. According to various embodiments of the invention, sonication and/or heating could be used to speed up this liftoff process.

Figure 2E:
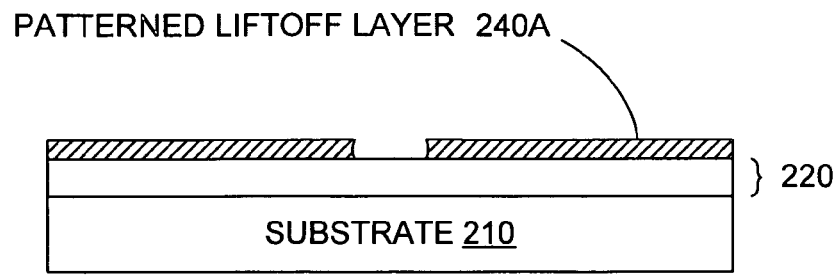

Once the liftoff operation is complete, what remains is a patterned liftoff layer 240A, as shown in FIG. 2E. Patterned liftoff layer 240A is therefore patterned with the inverse of the pattern formed by printed element 230. According to an embodiment of the invention, patterned liftoff layer 240A can comprise actual device structures (e.g., contact pads for an IC, electrodes for a transistor device or any other structure in substrate 210, or bus lines). According to another embodiment of the invention, patterned liftoff layer 240A can comprise a mask for further processing of base layer 220.

Figure 2F:
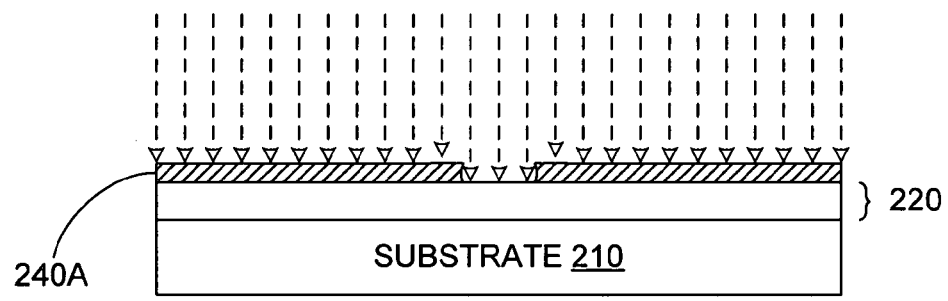
Figure 2G:
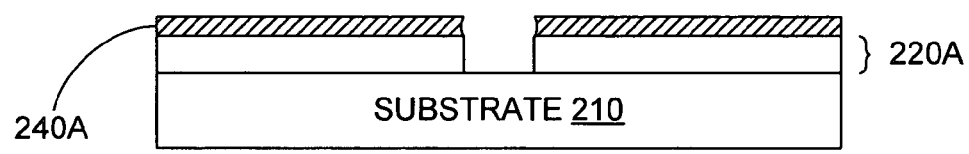
Figure 2H:
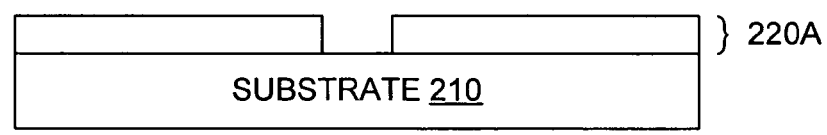

For example, patterned liftoff layer 240A can act as an etch mask for base layer 220, as shown in FIG. 2F, to create a patterned base layer 220A, as shown in FIG. 2G. Patterned liftoff layer 240A can then be removed, leaving only patterned base layer 220A, as shown in FIG. 2H. In this manner, an etch operation can be performed on base layer 220 without using any photolithography operations.

Multilayer Liftoff Pattern Printing

Figure 3A:
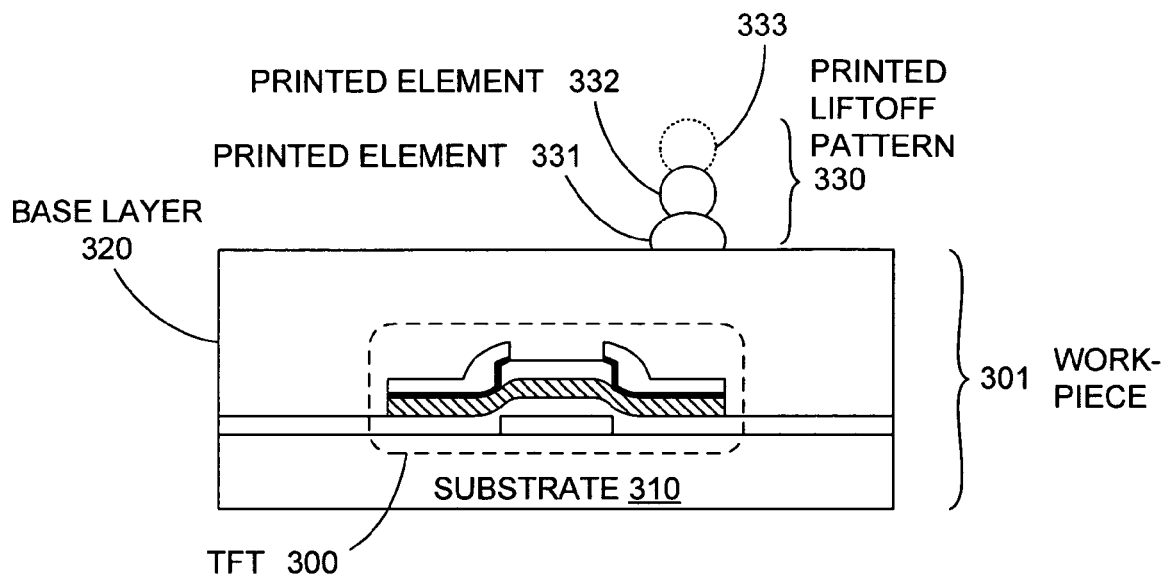
FIGS. 3A, 3B, 3C, 3D, 3E, 3F, 3G, 3H, 3I, 3J, 3K, 3L, 3M, and 3N are stages in a printing-based liftoff process, in accordance with another embodiment of the invention.

According to various other embodiments of the invention, the printed liftoff pattern can be formed by making multiple printing passes across the same location(s). The resulting multilayer pattern can then be used to create a patterned liftoff layer having beneficial masking characteristics. For example, FIG. 3A shows a multi-layer printed liftoff pattern 330 that is formed from printed elements 331 and 332. Note that while multi-layer printed liftoff pattern 330 is described as being formed from two layers for exemplary purposes, according to various embodiments of the invention, any number of layers could be used, as indicated by optional (dotted line) printed element 333.

Figure 3B:
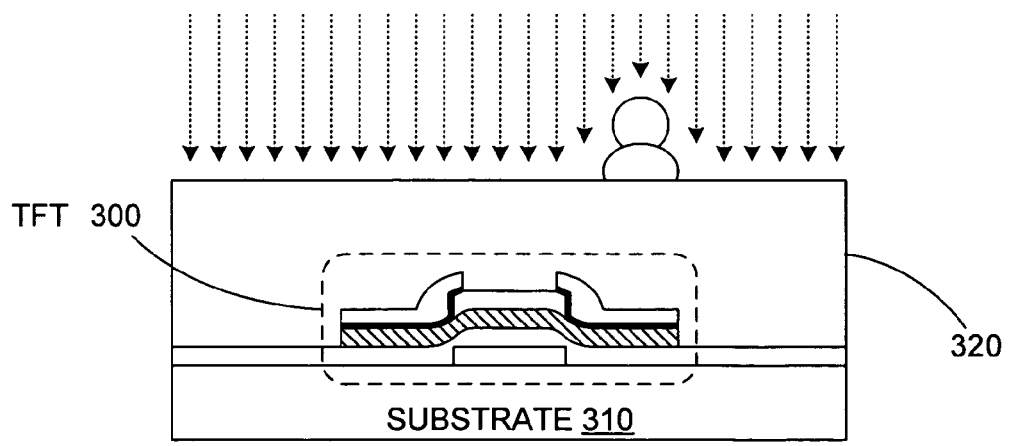

Printed liftoff pattern 330 is formed on a base layer 320 in a workpiece 301. Base layer 301 covers a TFT 300 (e.g., a TFT in a display or image sensor IC) formed in a substrate 310. Base layer 320 can, for example, comprise an oxide layer for protecting TFT 300. Note that TFT 300 is depicted for exemplary purposes only, and can be replaced with any other structure or device. As shown in FIG. 3B, an optional surface treatment can be performed to improve liftoff layer adhesion to base layer 320 (as described with respect to FIG. 2B).

Figure 3C:
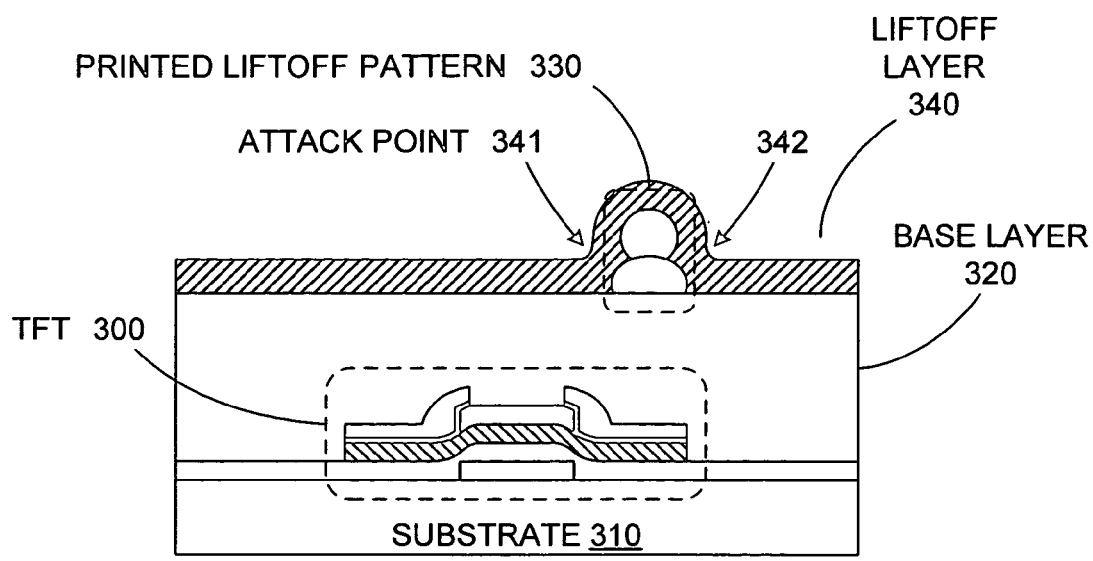

In FIG. 3C, a liftoff layer 340 is blanket deposited over base layer 320 and liftoff pattern 330. Liftoff layer 340 can comprise any material that can be formed over both base layer 320 and printed liftoff pattern 330, and that can withstand the solvent used to strip printed liftoff pattern 330 from base layer 320.

Figure 3D:
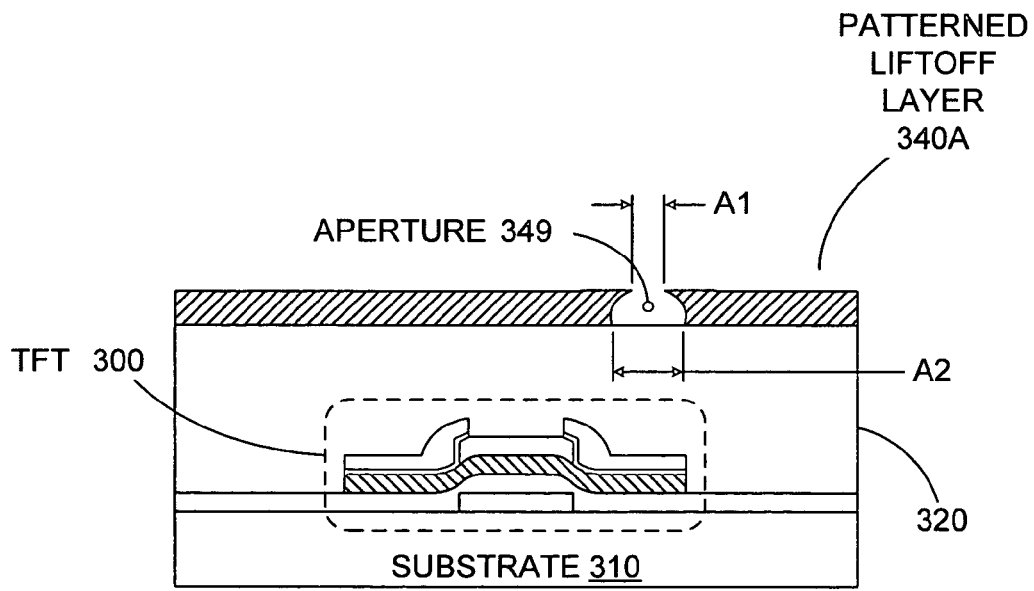

Just as described with respect to FIG. 2C, the profile of printed liftoff pattern 330 creates attack points 341 and 342 that provide thinned regions of liftoff layer 340 that provide access to printed liftoff pattern 330 during a subsequent strip operation. Thus, during a strip (liftoff) operation, printed liftoff pattern 330 is dissolved via attack points 341 and. 342, which in turn removes the overlying portion of liftoff layer 340, thereby forming a patterned liftoff layer 340A, as shown in FIG. 3D. According to various other embodiments of the invention, the strip operation can be accelerated via sonication and/or heating.

Figure 3E:
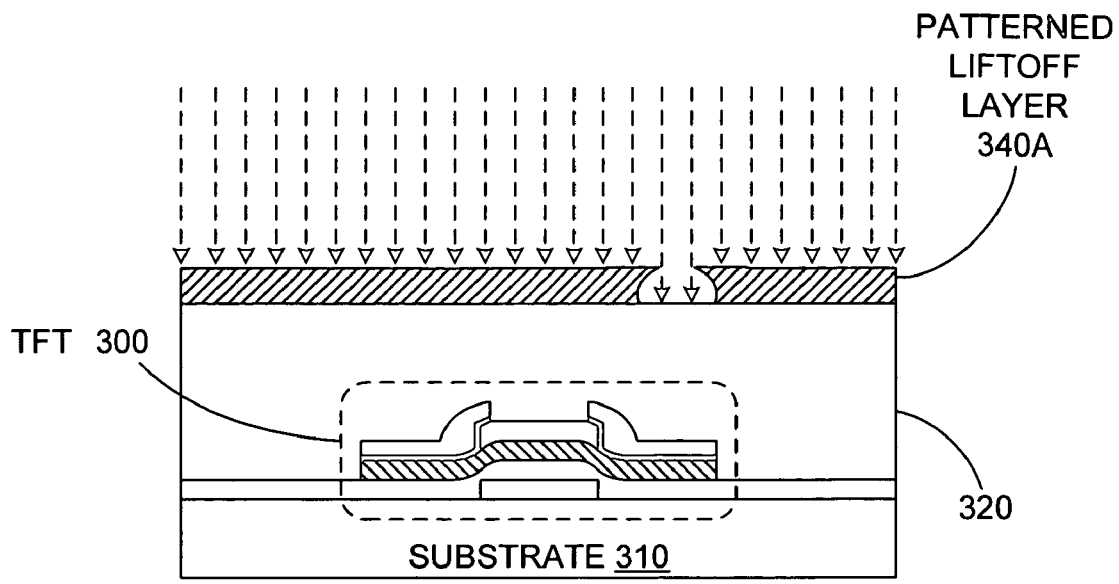
Figure 3F:
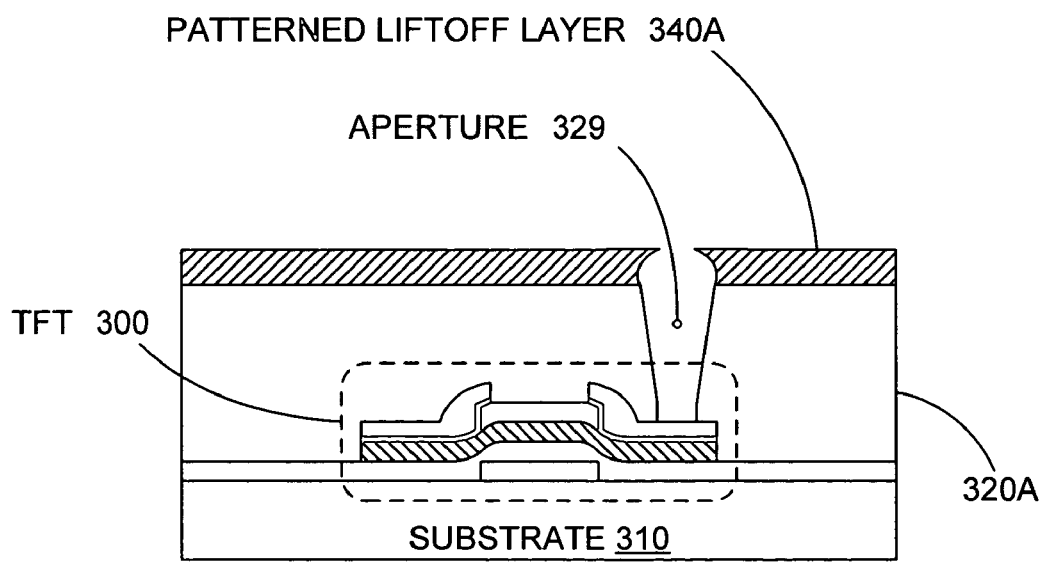

By allowing printed element 331 to partially solidify before depositing printed element 332, printed liftoff pattern 330 will retain a scalloped sidewall (cross sectional) profile, as shown in FIGS. 3A-3C. This scalloped sidewall profile causes an aperture 349 formed in patterned liftoff layer 340A to exhibit a diverging (overhanging) profile. In other words, a width A1 at the top of aperture 349 is less than a width A2 of the exposed surface of base layer 320 at the bottom of aperture 349. Because of this diverging aperture profile, when patterned liftoff layer 340A is used as an etch mask for base layer 320, as shown in FIG. 3E, an aperture 329 etched into base layer 320 through aperture 349 to TFT 300 exhibits a converging profile (i.e., the aperture width narrows with depth), as shown in FIG. 3F. According to an embodiment of the invention, the curved sidewall profile that defines aperture 349 may be used to enhance this "converging etch" effect by causing the etch rate (in a plasma or dry etch process) at the portion of base layer 320 beneath the overhanging portions of the sidewalls to be less than the etch rate at the portion of base layer 320 that is directly exposed to the etchant.

Figure 3G:
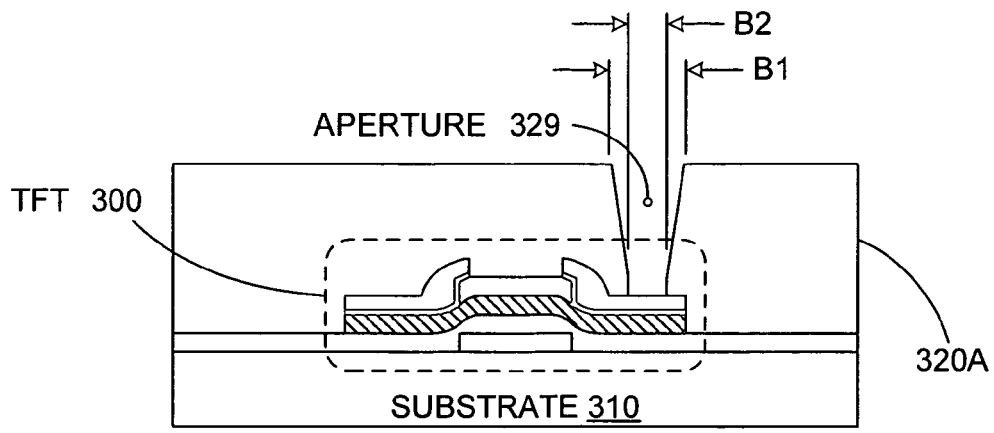

Thus, when patterned liftoff layer 340A is removed (post-etch), as shown in FIG. 3G, aperture 329 in patterned base layer 320A has an upper width B1 and a lower width B2, with upper width B1 being larger than lower width B2. As is known in the art, this type of converging via (or trench) profile improves the performance of subsequent fill operations by minimizing void formation between the filler material and the via (or trench). By making use of a multi-layer printed liftoff pattern, the invention can consistently produce this desirable converging aperture profile.

According to another embodiment of the invention, base layer 320 can be treated to have a hydrophobic surface (e.g., by applying a self-assembling monolayer (such as OTS or HMDS) to the surface of base layer 320), thereby causing the printed liftoff pattern to have very round cross-sectional profile. A liftoff process that makes use of liftoff pattern with a large enough round cross-sectional profile can create a diverging aperture profile similar to that shown in FIG. 3F. According to another embodiment of the invention, a printed liftoff pattern having a round cross-sectional profile can also be created by controlling the temperature of substrate 310 to rapidly cool the printed material in place.

Figure 4:
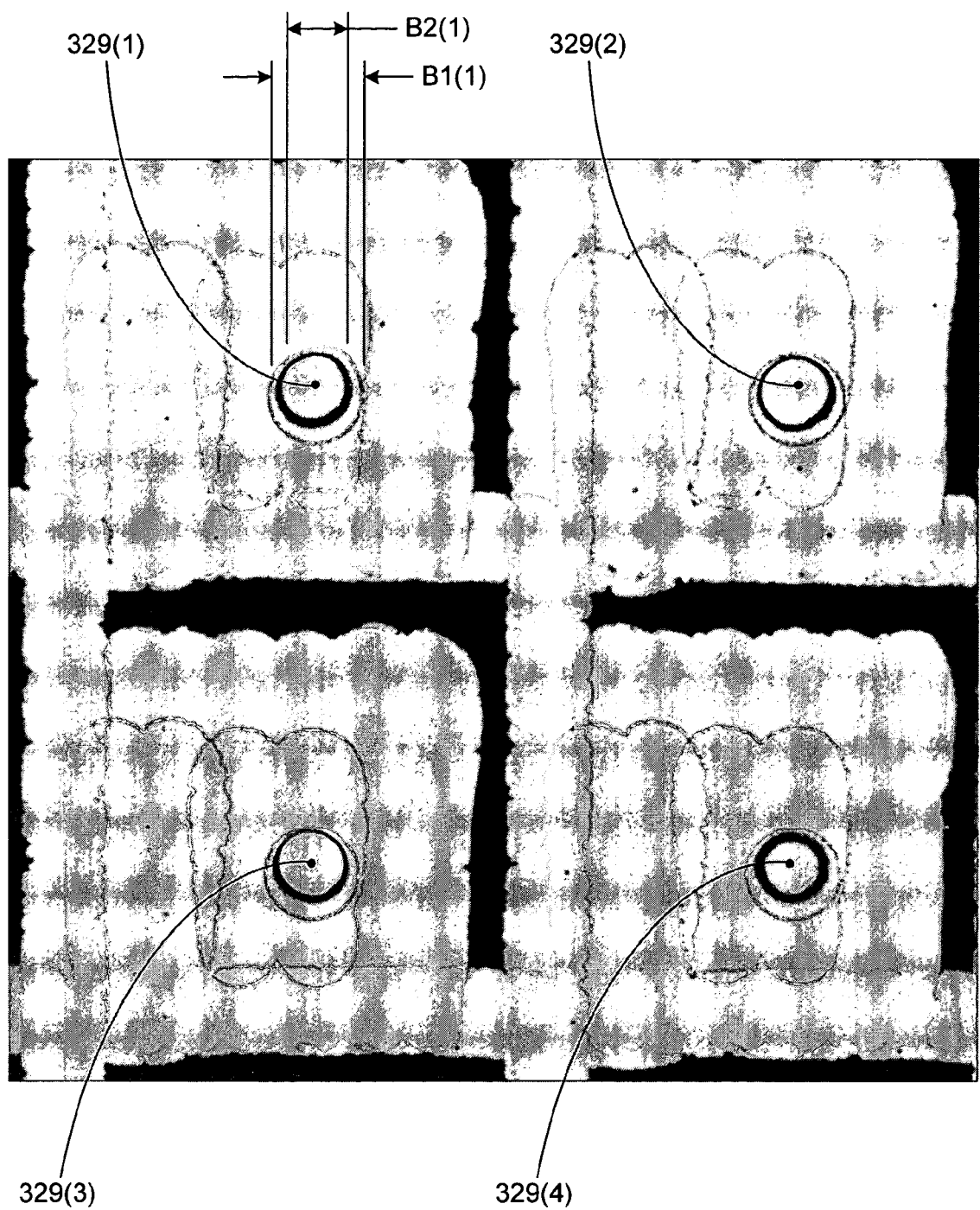
FIG. 4 is a micrograph of a via produced using the printing-based liftoff process described in FIGS. 3A-3G.

FIG. 4 shows an enlarged micrograph (top view) of sample vias 329(1), 329(2), 329(3), and 329(4) that were all produced using the multi-layer printed liftoff pattern described with respect to FIGS. 3A-3G. Each of vias 329(1), 329(2), 329(3), and 329(4) exhibits the converging aperture profile described with respect to FIG. 3G. For example, via 329(1) has an upper aperture width B1(1) and a lower aperture width B2(1), with upper aperture width B1(1) being larger than lower aperture width B2(1). Vias 329(2), 329(3), and 329(4) exhibit similar aperture profile characteristics.

Figure 3H:
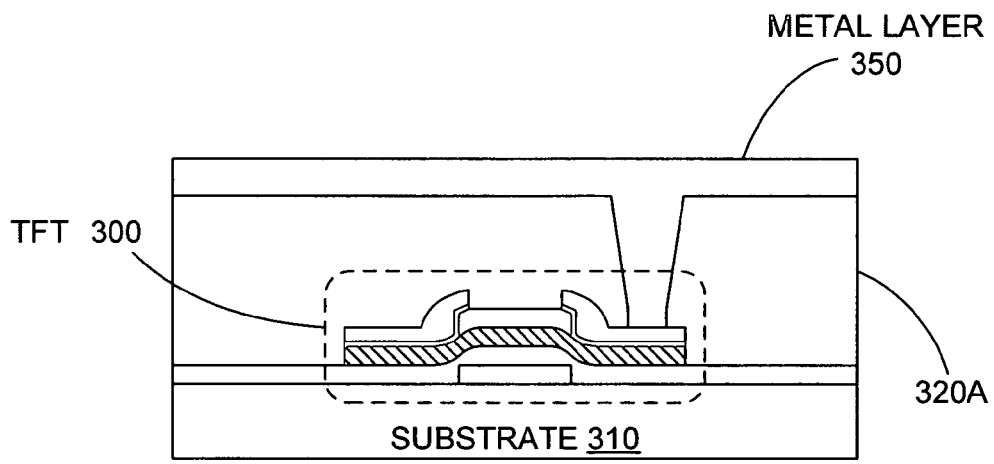
Figure 3I:
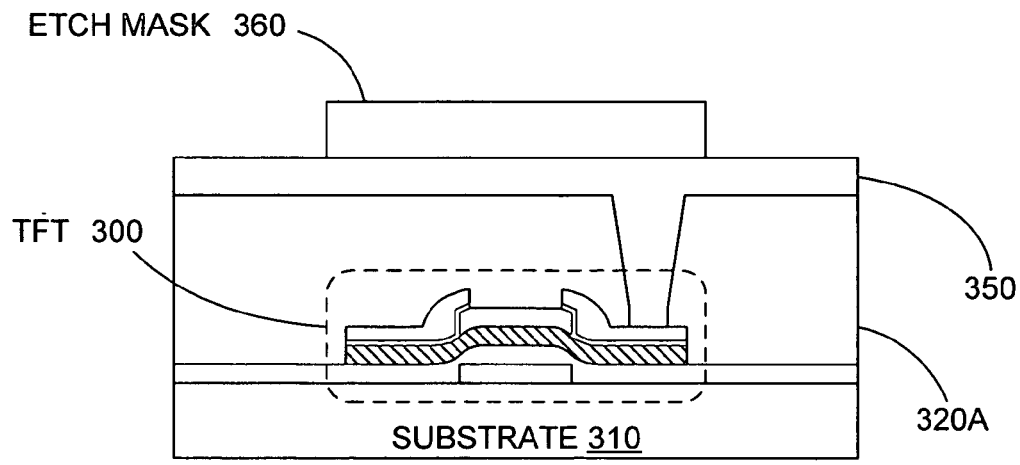

Returning to FIG. 3G, once aperture 329 is formed through base layer 320A, a via plug and contact pad (electrode) for TFT 300 can be produced using conventional techniques. For example, FIGS. 3H-3L depict the formation of a plug and contact for TFT 300 in aperture 329. In FIG. 3H, a metal layer 350 is formed over patterned base layer 320A. Metal layer 350 also fills aperture 329 down to TFT 300 to form a plug (interconnect between different IC layers).

Next, an etch mask 360 is formed over metal layer 350 to define a desired contact area. According to various embodiments of the invention, etch mask 360 can be formed using the liftoff technique described with respect to FIGS. 3A-3F, various other IC printing techniques (e.g., as described in co-owned, co-pending U.S. patent application Ser. No. [xC-030]) or standard photolithography techniques.

Figure 3J:
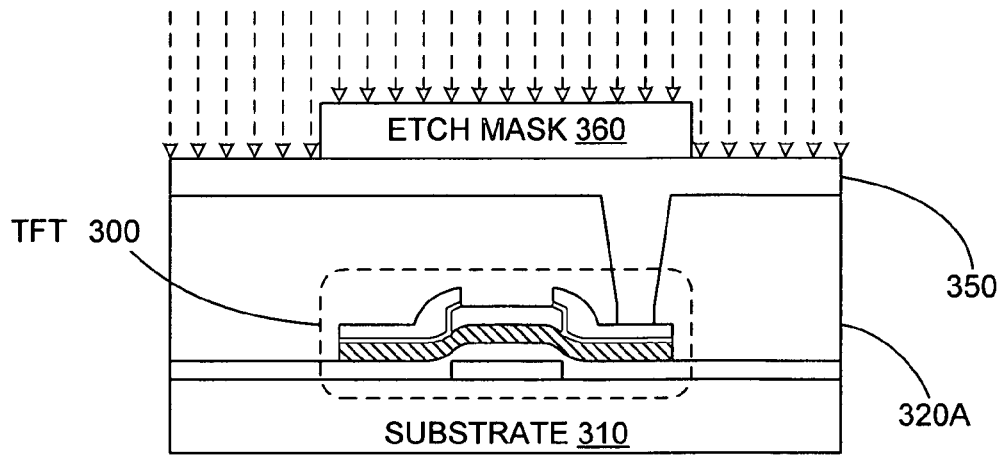
Figure 3K:
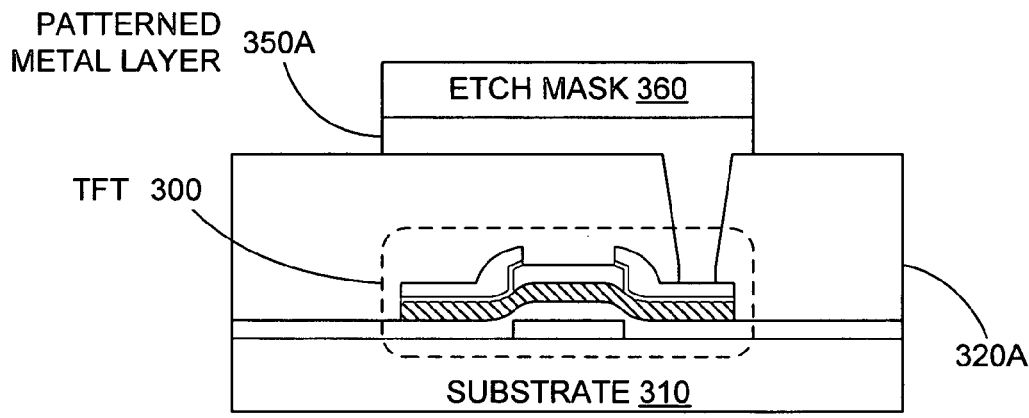
Figure 3L:
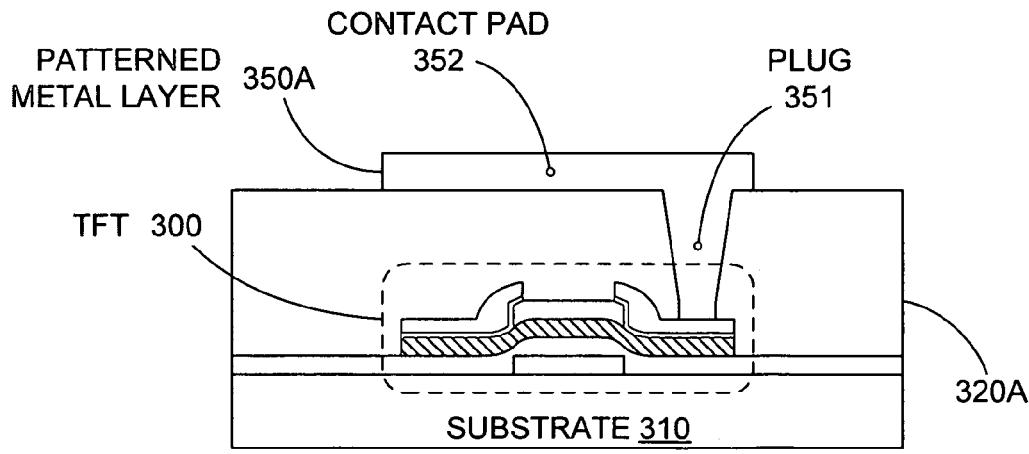

Then, as shown in FIG. 3J, an etch operation is performed and the portions of metal layer not covered by etch mask 360 are etched away, leaving behind a patterned metal layer 350A, as shown in FIG. 3K. Thus, when etch mask 360 is removed in FIG. 3L, patterned metal layer 350A includes a contact pad 352 and a plug 351 that is in contact with TFT 300. As noted above, plug 351 fills the via in patterned base layer 320A with minimal voids due to the converging profile of aperture 329. In this manner, robust electrical connectivity to TFT 300 is provided at contact pad 352.

Figure 3M:
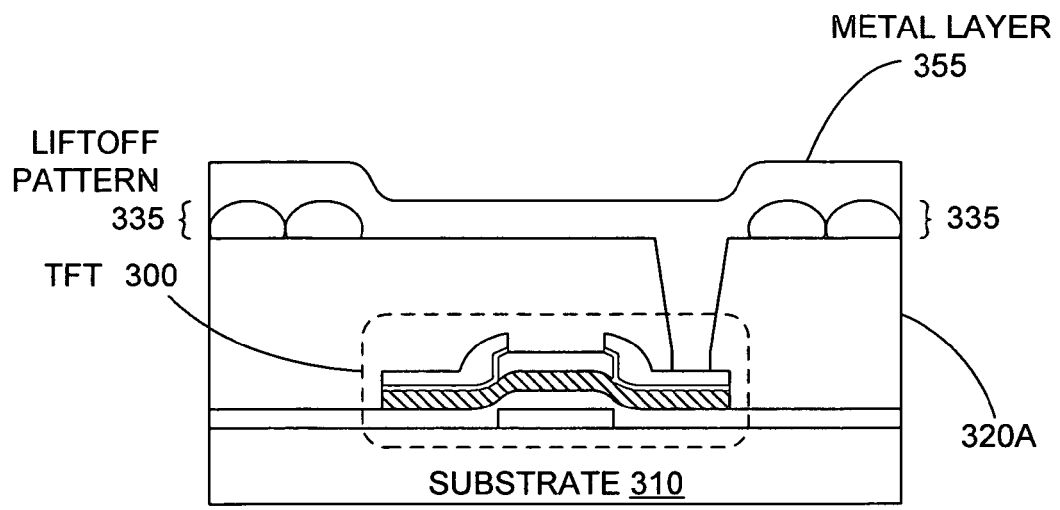
Figure 3N:
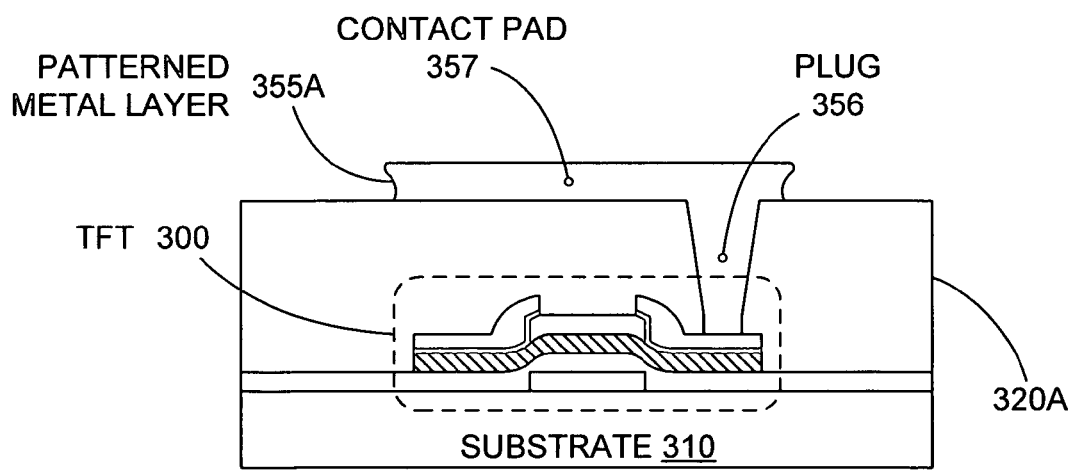

Note that according to another embodiment of the invention, contact pad 352 can itself be created by a liftoff process as depicted in FIGS. 3M and 3N. In FIG. 3M, a liftoff pattern 335 is printed directly on patterned base layer 320A (on the portions of patterned base layer 320A outside of the desired location for contact pad 352), and a metal layer 355 is formed over patterned base layer 320A and printed liftoff pattern 335. Then, when a liftoff operation removes liftoff pattern 335 and the overlying portions of metal layer 355, a patterned metal layer 355A is formed that includes a contact pad 357 and a plug 356 that is in contact with TFT 300, as shown in FIG. 3N.

Liftoff Pattern Printing Enhancement

Typically, pattern printing involves depositing a printing fluid by raster bitmap along a single axis (the "print travel axis") across a solid substrate. Print heads, and in particular, the arrangements of the ejectors incorporated in those print heads, are optimized for printing along this print travel axis.

Thus, the printing of a liftoff pattern using a similar system will take place in the same raster fashion, with the print head making "printing passes" across the substrate as the ejector(s) in the print head dispense individual droplets of printing fluid onto the substrate. At the end of each printing pass, the print head makes a perpendicular shift relative to the print travel axis before beginning a new printing pass. The print head continues making printing passes across the substrate in this manner until the liftoff pattern has been fully printed.

Figure 5:
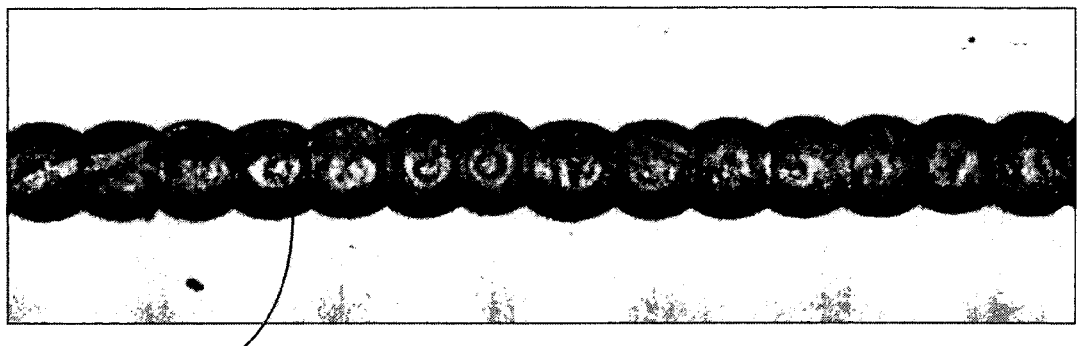
FIG. 5 is a micrograph of a multi-pass printed feature.

Because of this raster printing methodology, printed elements formed from multiple printing passes (i.e., multi-pass features) will often exhibit undesirable plan-view edge scalloping (in contrast to the often desirable sidewall scalloping described with respect to FIGS. 3A-3F). For example, FIG. 5 shows a micrograph of a printed element 500 that was printed in multiple printing passes. Because the time between printing passes allowed each printing fluid droplet to partially solidify before the next printing fluid droplet was printed, the droplets were not able to coalesce. Consequently, printed element 500 exhibits significant edge scalloping, as the outlines of the individual printing fluid droplets are clearly visible.

According to an embodiment of the invention, this type of edge-scalloping can be minimized when printing a liftoff pattern by separating a liftoff pattern into discrete design layers having only parallel layout features. Those discrete design layers can then be printed in separate printing operations, with the printing direction of each printing operation being aligned with the parallel layout features of the design layer being printed. In this manner, the printing of multi-pass features can be avoided, and homogenous, smooth-edged liftoff patterns can be printed.

Figure 6A:
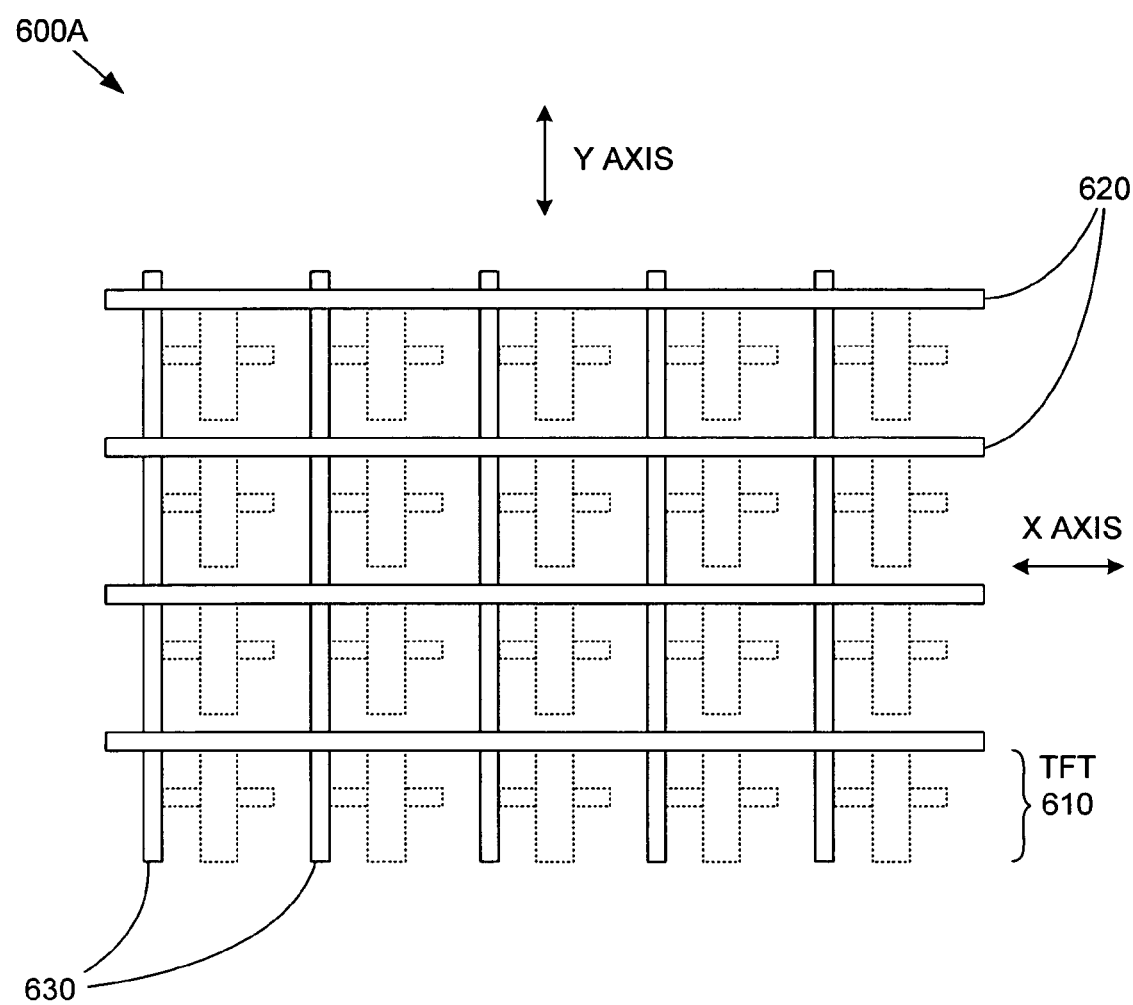
FIG. 6A is a sample liftoff pattern layout.

For example, FIG. 6A shows an example liftoff pattern 600A that includes multiple address lines 620 and word lines 630. Address lines 620 and word lines 630 could, for example, comprise interconnect lines for an array of TFTs 610 (shown in dotted lines for reference). Because liftoff pattern 600A includes elements running parallel to both the X axis (elements 620) and the Y axis (elements 630), printing liftoff pattern 600A using conventional liftoff pattern printing systems would result in the printing of multi-pass features, regardless of whether the print direction was parallel to the X axis or parallel to the Y axis.

Figure 6B:
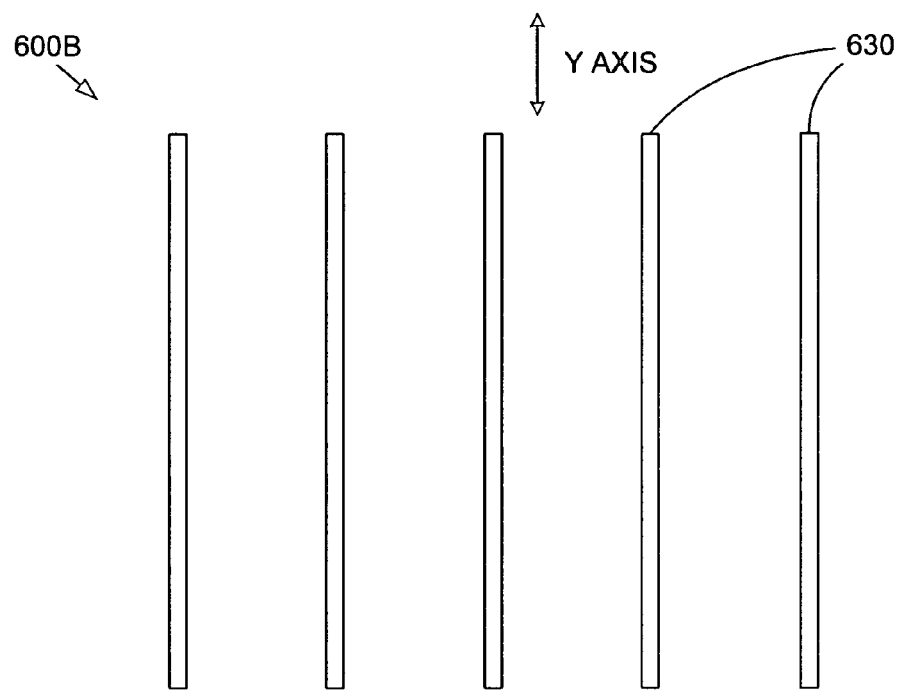
FIGS. 6B and 6C are design layers taken from the sample liftoff pattern layout of FIG. 6A, in accordance with an embodiment of the invention.
Figure 6C:
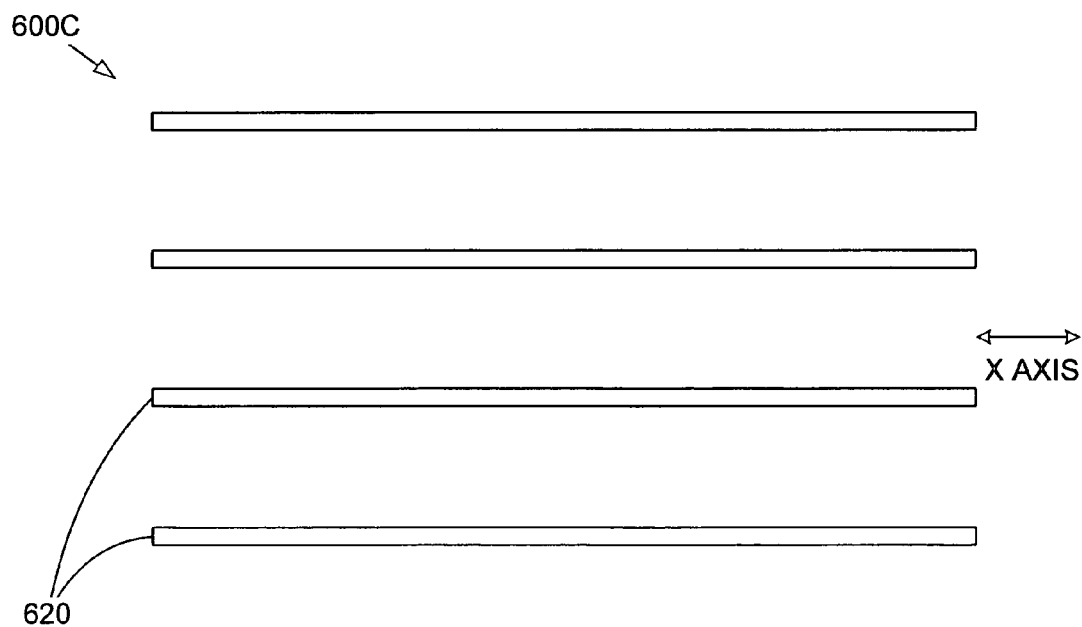

However, according to an embodiment of the invention, liftoff pattern 600A can be separated into multiple design layers, such as design layers 600B and 600C, shown in FIGS. 6B and 6C, respectively. Design layer 600B in FIG. 6B includes all the elements 630 (e.g., word line elements) of liftoff pattern 600A, which run parallel to the Y axis, while design layer 600C in FIG. 6C includes all the elements 620 (e.g., address line elements) of liftoff pattern 600A, which run parallel to the X axis. Note that the terms "X axis" and "Y axis" as used herein merely describe two orthogonal axes, and do not specify any absolute frame of reference.

Once design layers 600B and 600C have been extracted from liftoff pattern 600A, the word and address lines of the final (printed) liftoff pattern can be printed in two separate printing operations. In a first printing operation, the print direction can be set parallel to the Y axis to print design layer 600B onto a substrate. Because design layer 600B only includes layout elements that run parallel to the Y axis, setting the print direction parallel to the Y axis will result in smooth-edged, structurally homogenous printed features.

In a second printing operation, the print direction can be set parallel to the X axis to print design layer 600C onto the substrate. Because design layer 600C only includes layout elements that run parallel to the X axis, setting the print direction parallel to the X axis will again result in smooth-edged, structurally homogenous printed features. The order of printing could be reversed, so long as the print direction associated with each design layer is maintained.

The "print direction," as used herein, refers to a specific axis relative to the substrate along which printing occurs. Therefore, two different print directions are associated with the first and second printing operations described above. This is true even if the print travel axis (i.e., the axis of movement of the print head relative to the printing system), or print travel axes, remain the same for both the first and second printing operations. As long as the rotational orientation of the substrate relative to the print head is different during the first and second printing operations, the two printing operations will have different print directions.

Note further that since the "print direction" refers to an axis, both positive and negative motion along that axis are considered to have the same the print direction. Also note that the print direction can comprise a curvilinear geometry (i.e., a non-straight-line axis) specifying a planar or non-planar path. Furthermore, while a liftoff pattern may not be divisible into design layers having only parallel layer features, so long as substantially all (generally 90% or more) of the layout features in a particular layer are parallel to one another, a significant benefit can be achieved.

Liftoff Pattern Printing Tool Calibration

Figure 7:
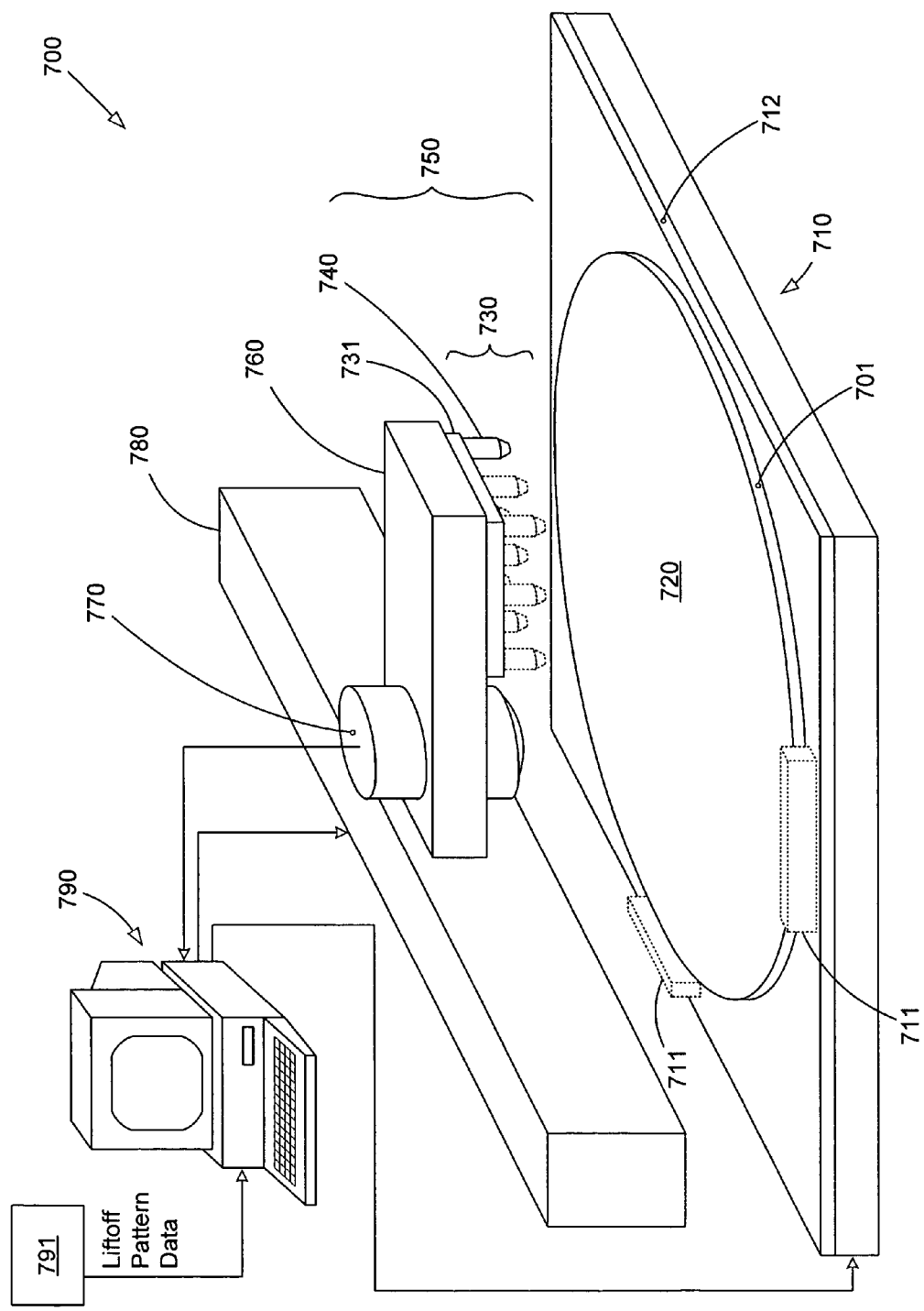
FIG. 7 is a perspective view of a liftoff pattern printing system in accordance with an embodiment of the invention.

FIG. 7 is a perspective view of a printing system 700 for printing liftoff patterns (e.g., printed element 230 in FIG. 2A and printed liftoff pattern 330 in FIG. 3A) in accordance with an embodiment of the invention. Printing system 700 includes a stage 710 for supporting (and optionally translating) a workpiece 701 (e.g., a wafer), a print assembly 750 mounted to a printing support structure 780, and a computer/workstation 790 that serves as both a system controller and data processor. Stage 710 includes a rotational platform 712 that allows the orientation of substrate 720 to be adjusted. Optional alignment features 711 on rotational platform 712 can be included to provide gross positioning and capture of workpiece 701.

Print assembly 750 includes a print head 730 (on a rotational fixture) and a camera 770 (having high magnification capabilities) mounted in a rigid mount 760. Print head 730 includes one or more ejectors 740 mounted in an ejector base 731. Ejectors 740 are configured to dispense droplets of the appropriate printing fluid on a base layer 720 of workpiece 701.

Computer/workstation 790 is configured to receive liftoff pattern data from a data source 791, and then provide appropriate control signals to printing support structure 780 and/or stage 710. Data source 791 can comprise any source of liftoff pattern data, including a networked computer, a liftoff pattern database connected via a local area network (LAN) or wide area network (WAN), or even a CD-ROM or other removable storage media. The control signals provided by computer/workstation 790 control the motion and printing action of print head 730 as it is translated relative to the base layer 720.

Note that the printing action can be provided by printing support structure 780, by stage 710, or by both in combination. Note further that the printing action does not have to involve actual movement of the print head itself, as print head 730 could be held stationary while stage 710 translates base layer 720. Computer/workstation 790 is also coupled to receive and process imaging data from camera 770. As will be described subsequently, camera 770 can provide both manual and automated calibration capabilities for printing system 700.

By properly calibrating and registering printing system 700 with respect to base layer 720, the liftoff pattern printed by printing system 700 can be precisely aligned with existing elements in workpiece 701, thereby ensuring a high-yield manufacturing process. According to an embodiment of the invention, system calibration can be accomplished with a video camera microscope (such as camera 770 shown in FIG. 7) having an optical axis position that is fixed relative to the ejector positions of the print head.

Figure 8:
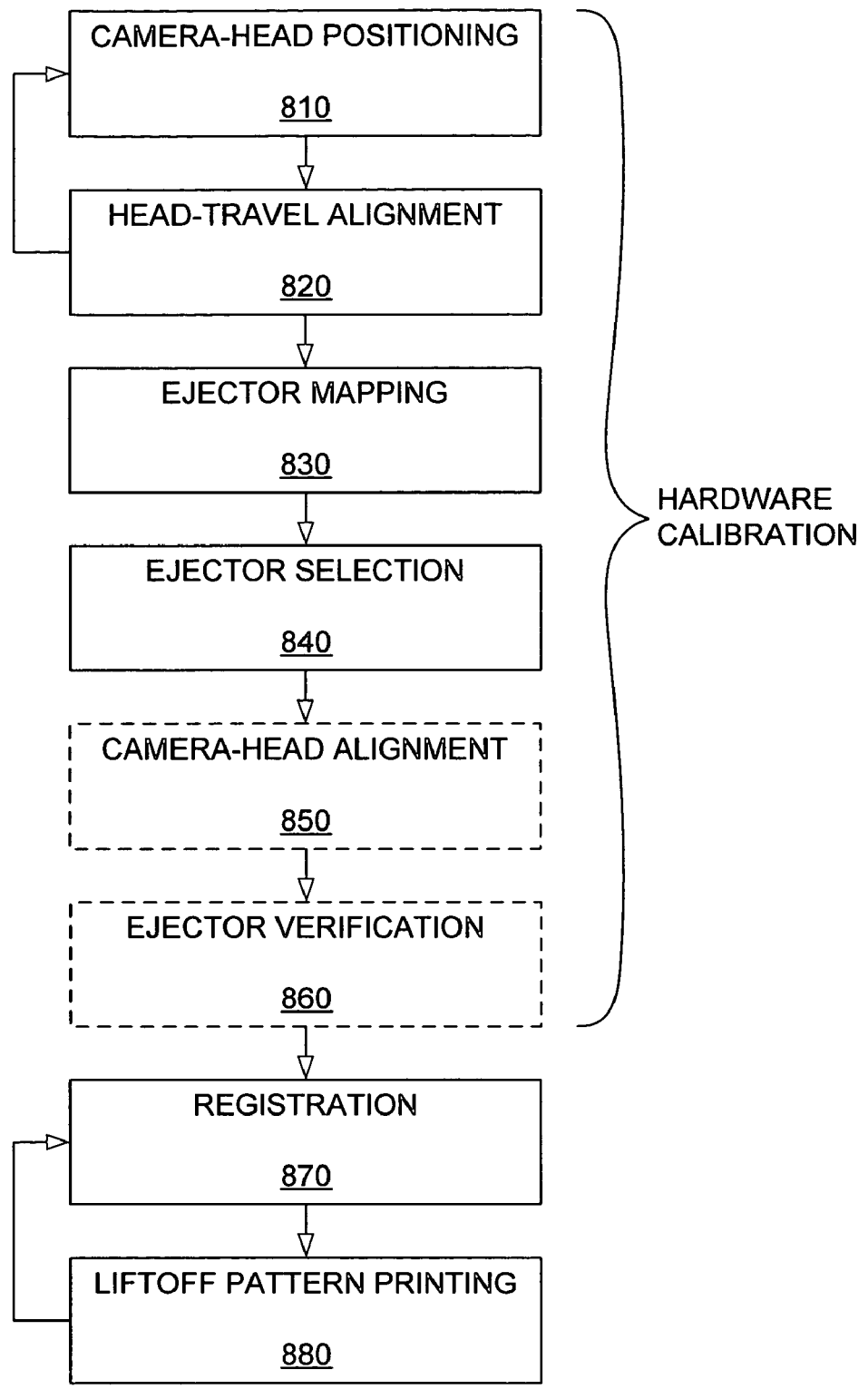
FIG. 8 is a flow diagram of a calibration and printing process for a liftoff pattern printing system according to an embodiment of the invention.

FIG. 8 shows a flow chart of a calibration and printing process in accordance with an embodiment of the invention. In step 810, the position of the ejectors relative to the camera is determined. Then in step 820, the print head is aligned with the print travel axis (or axes) of the printing system. Note that adjustments made in step 820 can require repetition of the camera-head positioning of step 810. In step 830, the "in use" positions of the ejectors (taking into account thermal expansion of the print head) are determined. In step 840, the ejectors are selection-filtered so that only those ejectors providing a desired degree of printing accuracy are used in the printing process. If the ejector(s) used in the camera-head positioning of step 810 are not selected to be used in step 840, another camera-head positioning operation is performed in step 850 using an ejector(s) selected in step 840. An optional verification step 860 can then be performed using those ejectors selected in step 840 to verify that the proper printing accuracy is provided by the calibrated printing system.

Next, during a registration step 870, printing system 700 is placed in a known position relative to base layer 720, thereby ensuring that the printed liftoff pattern will be properly aligned with any existing features within base layer 720. Finally, the liftoff pattern is printed in step 880. According to an embodiment of the invention, step 880 can involve separating the liftoff pattern into design layers having parallel elements, and printing those design layers in separate printing operations, as described with respect to FIGS. 6A-6C. In such a case, the process can loop back to registration step 870 before the printing of each design layer.

Note that various other embodiments of the invention can include any combination of the steps shown in FIG. 8. The individual steps in the flow chart of FIG. 8 are discussed in greater detail below.

Camera-Head Positioning (Step 810)

The first step in any calibration operation using such a camera requires that the position of the camera relative to the print head be accurately determined. This "camera-to-print-head position" determination can be readily made since both the camera and print head are held in fixed positions relative to each other. For example, FIG. 9A (to be discussed in greater detail subsequently) shows a camera 770 and print head 731 mounted in a print assembly 750. One way to determine the position of camera 770 relative to a selected ejector (e.g., ejector 740(0)) is to print a spot (e.g., 725(0)) from the selected ejector and measure the horizontal offset Ch and vertical offset Cv required to position a reference mark 771 in the imaging area of camera 770 directly over the spot. Various other methods will be readily apparent.

Head-Travel Alignment (Step 820)

Figure 9A:
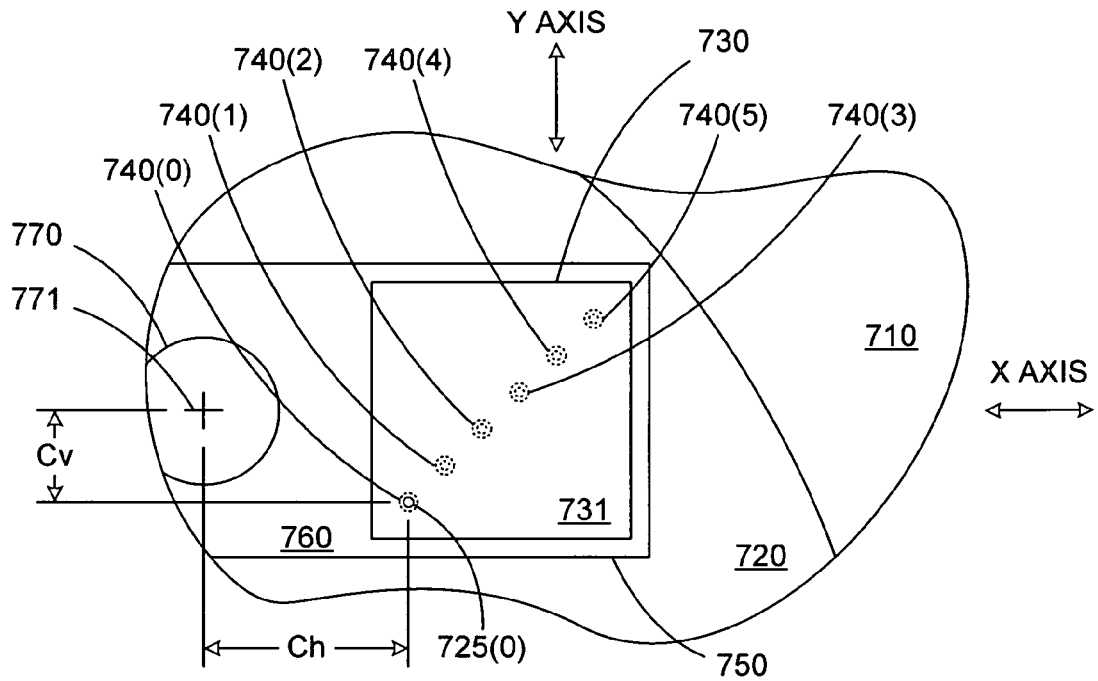
FIGS. 9A and 9B are diagrams of a print head to print travel axis alignment process according to another embodiment of the invention.
Figure 9B:
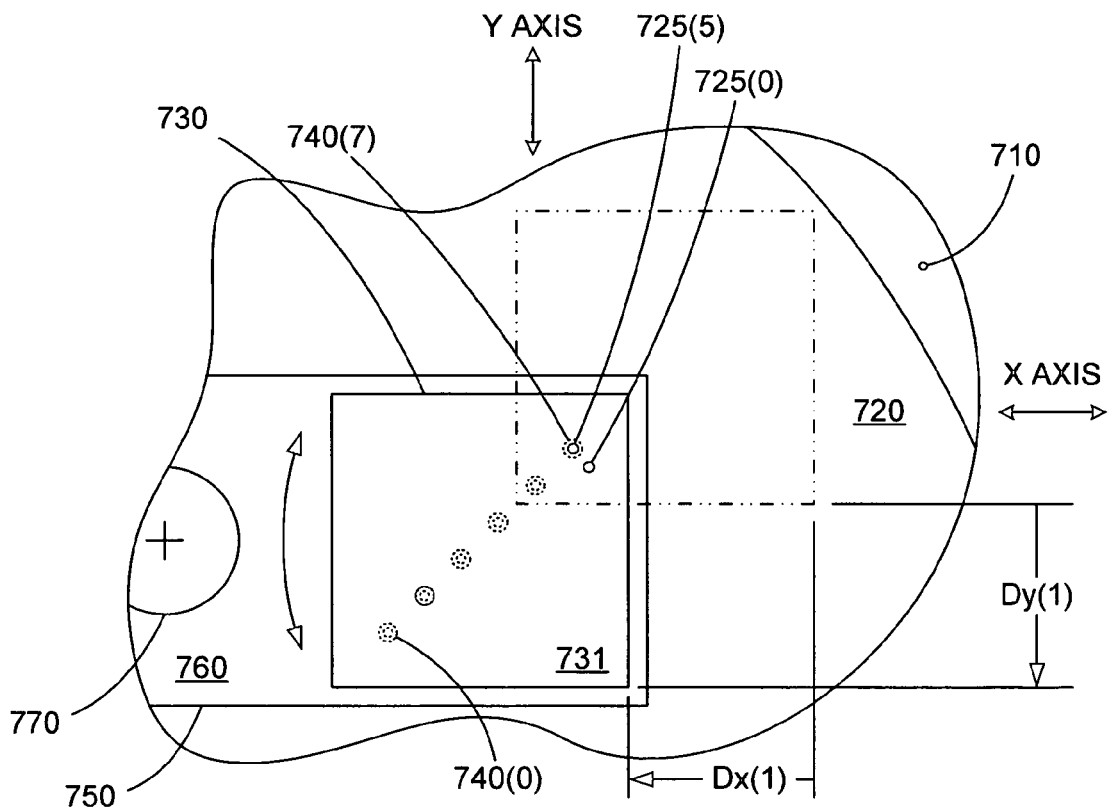

A print head having multiple ejectors must be accurately aligned with the print travel axis (axes) of the liftoff pattern printing system in which it is used, so that a drop of printing fluid can be placed at any desired location on a base layer with a desired accuracy. If there is angular misalignment between the print head relative to the print travel axis, the liftoff pattern produced by the print head will exhibit a corresponding amount of distortion. FIGS. 9A and 9B provide detail views of a liftoff pattern printing system that depict a method for performing this print head to print travel alignment according to an embodiment of the invention.

In FIG. 9A, a print assembly 750 (such as shown in FIG. 7) is positioned over a base layer 720 on a stage 710. Print assembly 750 includes a print head 730 and a camera 770 mounted in a rigid mount 760. Print head 730 comprises ejectors 740(0)-740(5) arranged in a diagonal line in an ejector base 731. Note that while six ejectors are depicted, print head 730 can include any number and arrangement of ejectors. A single spot 725(0) is printed on base layer 720 by a first selected one of ejectors 740(0)-740(5)—in this case ejector 740(0).

Then, as shown in FIG. 9B, print assembly 750 is translated by a distance Dx(1) in the X axis direction and a distance Dy(1) in the Y axis direction, with distances Dx(1) and Dy(1) representing the values expected to position a second selected ejector (in this case ejector 740(5)) over spot 725(0). Ejector 740(5) then prints a second spot 725(5).

Camera 770 can then be used to measure the distance between spots 725(0) and 725(5), and the orientation of print head 730 can be adjusted with respect to base layer 720 (or stage 710) to compensate for the misalignment. Note that this relative rotation of print head 730 can be accomplished by actually rotating print head 730 within fixed mount 760 (as indicated by the curved arrow), or by leaving the position of print head 730 unchanged and rotating stage 710.

Figure 9C:
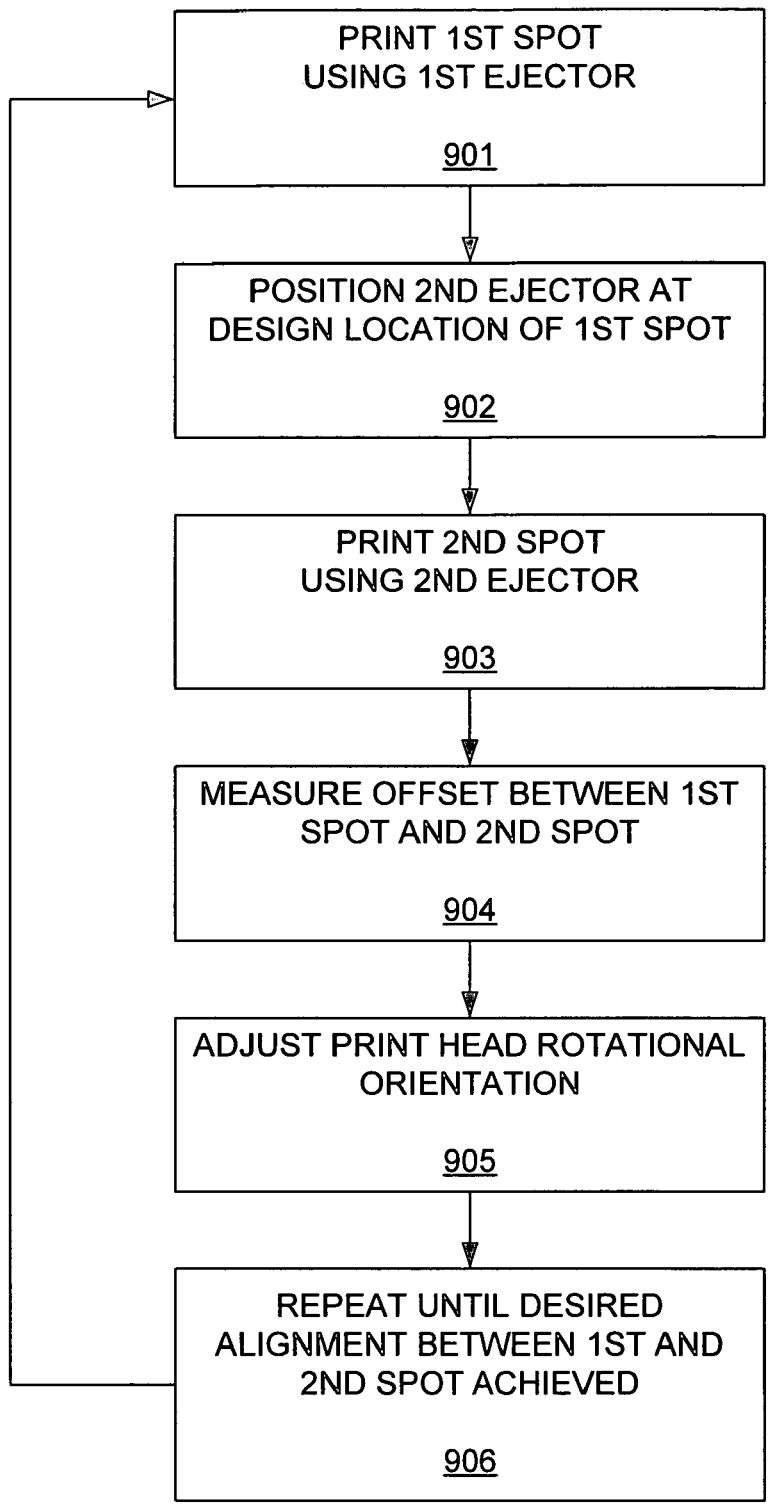
FIG. 9C is a flow diagram of the print head to print travel axis alignment process shown in FIGS. 9A and 9B, according to another embodiment of the invention.

After recalibrating the camera to ejector/drop location, the two ejectors (730(0) and 730(5)) can then be used to print two more drops at a single location to determine if further rotational correction is required. This type of iteration can be continued until the spots produced by the two ejectors align within a desired degree of accuracy. This process is summarized in steps 901-906 of the flow chart shown in FIG. 9C.

Liftoff Pattern Registration (Step 870)

Because printing a liftoff pattern in accordance with the invention will generally be part of a larger production process, a registration step can help to ensure that the liftoff pattern (and hence the structures formed via the liftoff process) will be properly aligned with existing elements in workpiece 701 (e.g., printed element 330 and TFT 300 in FIG. 3A). In addition, if the liftoff pattern is to be printed using multiple printing operations (as described with respect to FIGS. 6A-6C), registration is required to ensure that the design layers printed during each print operation are aligned with each other. According to an embodiment of the invention, these alignments can be facilitated via a set of alignment marks on the substrate that the camera mounted in the print assembly (e.g., camera 770 shown in FIG. 7) can-use to perform a registration operation.

Figure 10A:
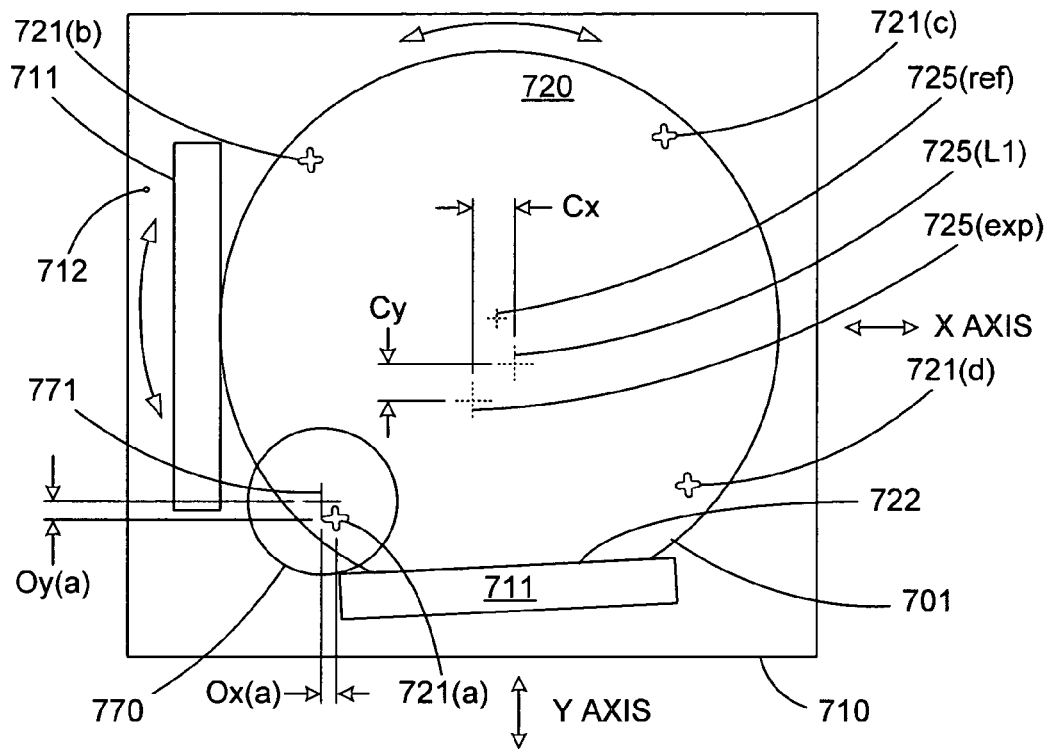
FIGS. 10A and 10B are diagrams of printed liftoff pattern alignment processes according to other embodiments of the invention.

FIG. 10A depicts a method for performing this registration operation according to an embodiment of the invention. In FIG. 10A, workpiece 701 is placed on a rotational platform 712 on a stage 710 and is positioned using standard positioning features such as a flat 722 on workpiece 701 and alignment features 711 on stage 710. Alignment marks 721(a)-721(d) are identified at known but unused locations on base layer 720. Note that while four alignment marks are depicted, base layer 720 could include any number of alignment marks (greater than one). Note further that while alignment marks 721(a)-721(d) are depicted as cross-shaped elements for explanatory purposes, they can comprise any shape capable of accurately indicating position.

To perform the registration of the printing system with respect to base layer 720 (and hence, workpiece 701), camera 770 is used to gauge the positional offset (i.e., a vector distance and direction) between the design position and actual position for each of alignment marks 721(a)-721(d). These measurements can be taken by placing camera 770 at the design position (by moving the camera and/or moving the substrate) and then comparing the actual position of the associated alignment mark with an alignment target 771 in the imaging sensor of camera 770 (the print assembly that houses camera 770 and its associated print head are not shown for clarity). For example, the offset for alignment mark 721(a) is determined from horizontal offset Ox(a) and vertical offset Oy(a). After each such measurement, or after a specified number of such measurements, workpiece 701 is rotated by rotational platform 712 (as indicated by the curved arrows). This measurement-rotation sequence is repeated until the offsets for each of alignment marks 721(a)-721(d) are the same (within a specified tolerance).

Then, camera 770 measures the position of each reference mark with respect to a predefined origin point and averages those measurements to obtain the actual location of an alignment reference point for alignment marks 721(a)-721(d) (indicated as location 725(ref)). The alignment reference point has a known position relative to a reference origin for base layer 720 (indicated as location 725(L1)), so once the actual location of the alignment reference point is known, the actual location of the reference origin for base layer 720 can be determined. According to an embodiment of the invention, the alignment reference point and the reference origin of base layer 720 can be coincident. The X axis and Y axis offsets, Cx and Cy, respectively, between the actual location of the reference origin of base layer 720 and its expected position (indicated as location 725(exp)) provide a translation vector that can be applied to the liftoff pattern (or design layer of the liftoff pattern) to be printed so that it is aligned with base layer 720, and hence aligned with the previously created elements (or design layers) on base layer 720. Note that this application of the translation vector can occur in the physical domain (e.g., adjusting the position/ orientation of the print head relative to the stage) or in the electronic domain (e.g., adjusting the values of the liftoff pattern data). This registration process is summarized in steps 1001-1007 in the flow chart shown in FIG. 10C.

Figure 10B:
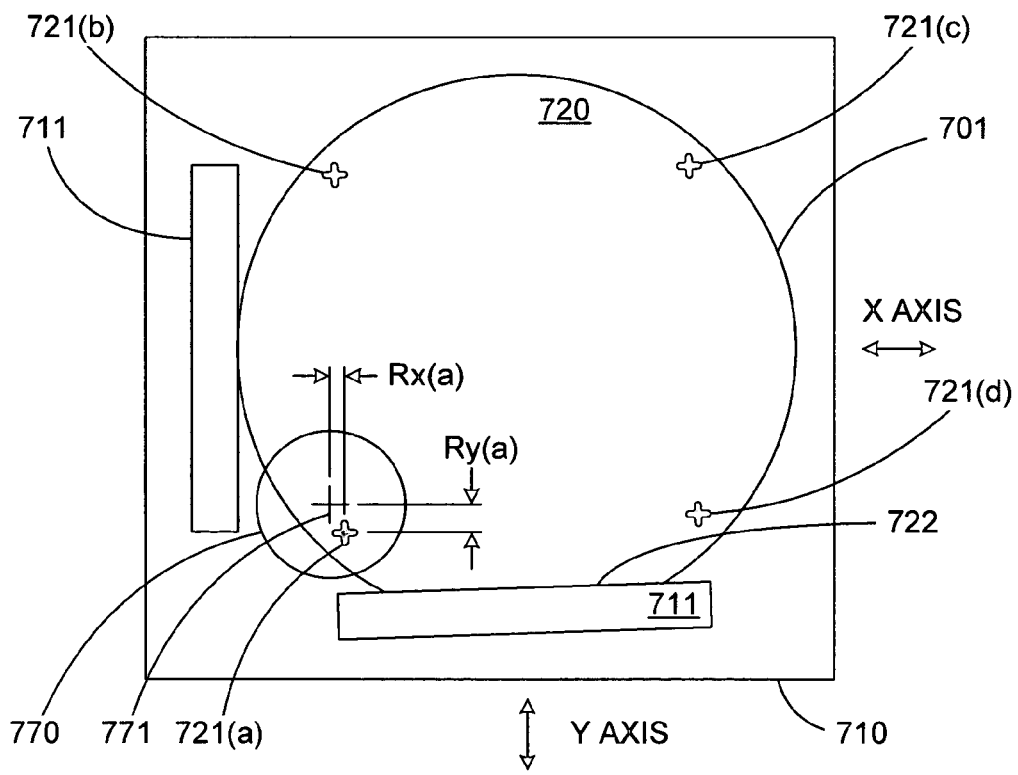
Figure 10C:
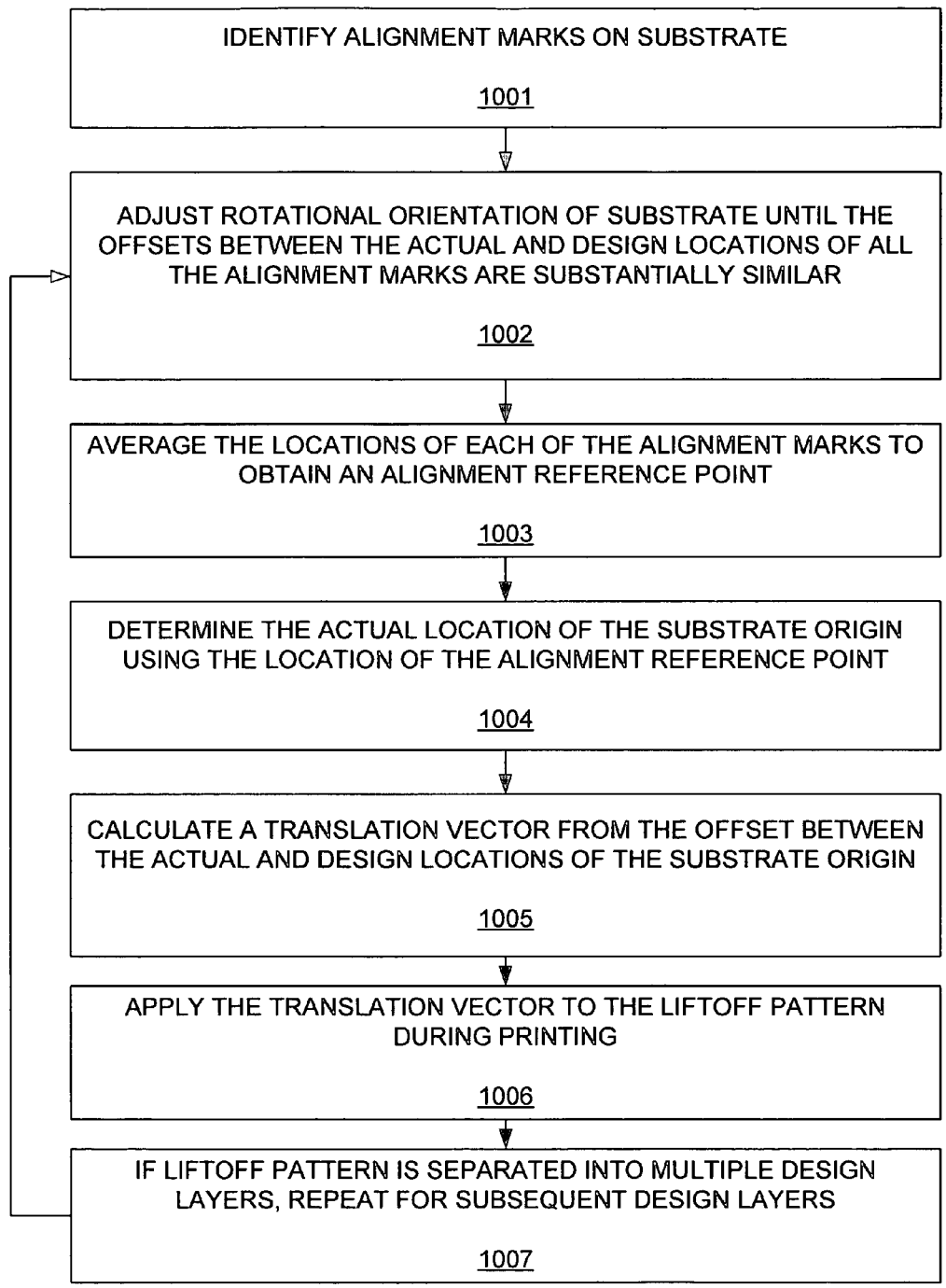
FIGS. 10C and 10D are flow diagrams of the printed liftoff pattern alignment processes shown in FIGS. 10A and 10B, respectively, according to other embodiments of the invention.

Note that if the print head only has a single ejector, the rotational orientation of the print head relative to the substrate is not as critical, since the single ejector can perform a vector printing operation. Therefore, while the registration process described above could be used for a single-ejector print head, a somewhat simpler layer alignment process could also be used. FIG. 10B depicts a registration operation for a single ejector print head in accordance with an embodiment of the invention. In FIG. 10B, workpiece 701 is placed on stage 710 and is positioned using standard positioning features such as a flat 722 on workpiece 701 and alignment features 711 on stage 710. Alignment marks 721(a)-721(d) are identified in known but unused locations on base layer 720. Note that while four alignment marks are depicted, any number of alignment marks (greater than one) could be present on base layer 720. Note further that while alignment marks 721(a)-721(d) are depicted as cross-shaped elements for explanatory purposes, they can comprise any shape capable of accurately indicating position.

Figure 10D:
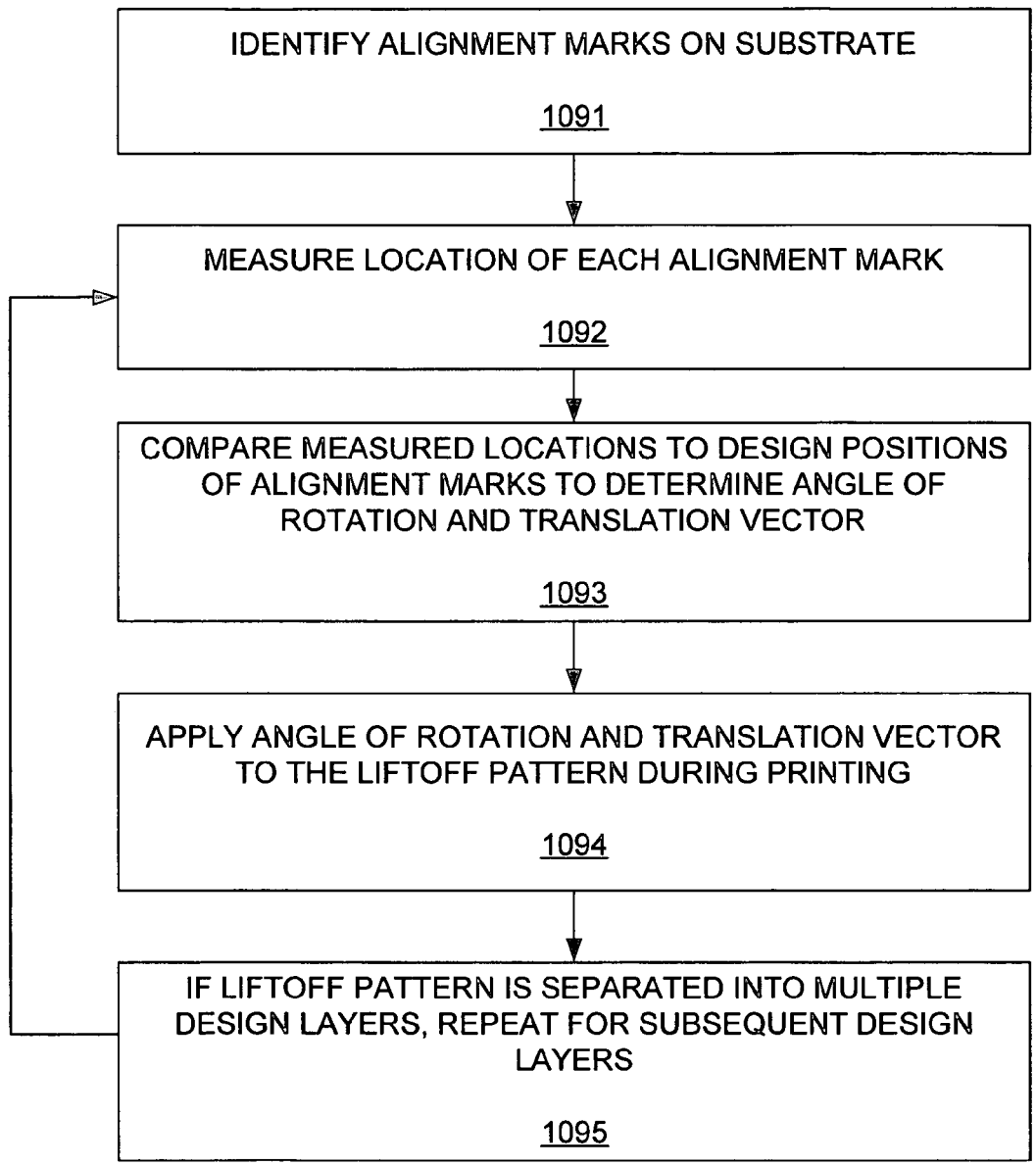

Camera 770 (the print assembly that houses camera 770 and its associated print head are not shown for clarity) measures the actual locations of alignment marks 721(a)-721(d) and determines their offsets from the design alignment mark positions. For example, the offsets in the X axis and Y axis directions for reference mark 721(a) are offsets Rx(a) and Ry(a), respectively. The measured offsets for all of reference marks 721(a)-721(d) can then be used to calculate an angle of rotation and translation vector to be applied to the liftoff pattern (or the design layer of the liftoff pattern) to be printed on base layer 720. This process is summarized in steps 1091-1095 of the flow chart shown in FIG. 10D.

Although the present invention has been described in connection with several embodiments, it is understood that this invention is not limited to the embodiments disclosed, but is capable of various modifications that would be apparent to one of ordinary skill in the art. For example, to create printed liftoff patterns having a relatively flat cross-sectional profile, the base layer could be treated to have a hydrophilic surface. Therefore, the invention is limited only by the following claims.

The invention claimed is:

1. A method for performing a liftoff operation, the method comprising:
   printing a liftoff pattern on a base layer;
   forming a blanket layer over the base layer, a first portion of the blanket layer covering the liftoff pattern; and
   removing the liftoff pattern and the first portion of the blanket layer from the base layer to create a patterned blanket layer,
   wherein printing the liftoff pattern comprises making multiple printing passes over a single location such that the liftoff pattern includes a first printed element formed during a first printing pass and a second printed element formed during a second printing pass, the second printed element being disposed on and located above the first printed element.

2. A method for performing a liftoff operation, the method comprising:
   printing a liftoff pattern on a base layer;
   forming a blanket layer over the base layer, a first portion of the blanket layer covering the liftoff pattern; and
   removing the liftoff pattern and the first portion of the blanket layer from the base layer to create a patterned blanket layer,
   wherein printing the liftoff pattern comprises:
   making a first plurality of printing passes in a first print direction to print a first plurality of elongated, structurally homogenous elements in the liftoff pattern, wherein each of the first plurality of elongated, structurally homogenous elements in the liftoff pattern runs parallel to the first print direction, and
   making a second plurality of printing passes in a second print direction to print a second plurality of elongated, structurally homogenous elements in the liftoff pattern, wherein each of the second plurality of elongated, structurally homogenous elements in the liftoff pattern runs parallel to the second print direction.

3. A method for creating an integrated circuit (IC), the method comprising:
   printing a liftoff pattern on a base layer, the base layer covering a contact of semiconductor device;
   forming a blanket layer over the base layer, a first portion of the blanket layer covering the liftoff pattern;
   removing the liftoff pattern and the first portion of the blanket layer to create a patterned blanket layer; and
   etching the base layer through the patterned blanket layer to form a patterned base layer, the patterned base layer including a via to the contact of the semiconductor device,
   wherein the via is located at a first location in the base layer, and
   wherein printing the liftoff pattern comprises making multiple printing passes over the first location in the base layer such that the liftoff pattern includes a first printed element formed during a first printing pass and a second printed element formed during a second printing pass, the second printed element being disposed on and located above the first printed element.

4. A method for etching a base pattern into a base layer, the method comprising:
   printing a liftoff pattern on the base layer;
   forming a blanket layer over the base layer, a first portion of the blanket layer being formed on the liftoff pattern;
   removing the liftoff pattern and the first portion of the blanket layer to create a patterned blanket layer; and
   etching the base layer using the patterned blanket layer as an etch mask to create the base pattern,
   wherein the base pattern defines a first aperture through the base layer at a first location in the base layer,
   wherein the patterned blanket layer defines a second aperture positioned over a desired location for the first aperture, the second aperture having a diverging aperture profile, and
   wherein printing the liftoff pattern comprises:
   performing a first printing pass over the first location to print a first liftoff pattern layer;
   performing a second printing pass over the first location to print a second liftoff pattern layer on the first liftoff pattern layer.

5. The method of claim 4, wherein printing the liftoff pattern further comprises performing a third printing pass over the first location to print a third liftoff pattern layer on the second liftoff pattern layer.

6. A method for etching a base pattern into a base layer, the method comprising:
   printing a liftoff pattern on the base layer;
   forming a blanket layer over the base layer, a first portion of the blanket layer being formed on the liftoff pattern;
   removing the liftoff pattern and the first portion of the blanket layer to create a patterned blanket layer; and
   etching the base layer using the patterned blanket layer as an etch mask to create the base pattern,
   wherein the base pattern defines a first aperture through the base layer at a first location in the base layer,
   wherein the patterned blanket layer defines a second aperture positioned over the first location, the second aperture having a diverging aperture profile, and
   wherein printing the liftoff pattern comprises:
   applying a hydrophobic treatment to the base layer; and
   ejecting a quantity of printing fluid onto the base layer at the first location.

7. A method for etching a base pattern into a base layer, the method comprising:
- printing a liftoff pattern on the base layer;
- forming a blanket layer over the base layer, a first portion of the blanket layer being formed on the liftoff pattern;
- removing the liftoff pattern and the first portion of the blanket layer to create a patterned blanket layer; and
- etching the base layer using the patterned blanket layer as an etch mask to create the base pattern,
- wherein printing the liftoff pattern comprises:
- performing a registration operation to align the base layer with a printing system; and
- ejecting printing fluid from a print head in the printing system onto the base layer to form the liftoff pattern,
- wherein the print head is a single-ejector print head, and wherein performing the registration operation comprises:
- identifying a plurality of alignment marks on the base layer; and
- measuring an actual location for each of the plurality of alignment marks;
- comparing the actual location of each of the plurality of alignment marks against a predefined reference location for each of the plurality of alignment marks to determine an angle of rotation and translation vector; and
- utilizing the angle of rotation and translation vector to align the liftoff pattern with the base layer.

8. A method for etching a base pattern into a base layer, the method comprising:
- printing a liftoff pattern on the base layer;
- forming a blanket layer over the base layer, a first portion of the blanket layer being formed on the liftoff pattern;
- removing the liftoff pattern and the first portion of the blanket layer to create a patterned blanket layer; and
- etching the base layer using the patterned blanket layer as an etch mask to create the base pattern,
- wherein printing the liftoff pattern comprises:
- performing a registration operation to align the base layer with a printing system; and
- ejecting printing fluid from a print head in the printing system onto the base layer to form the liftoff pattern,
- wherein the print head includes at least one ejector, wherein a camera is rigidly connected to the print head, the camera having an imaging sensor comprising an alignment target, and wherein registering the printing system comprises:
- identifying a plurality of alignment marks on the base layer;
- adjusting a rotational orientation between the base layer and the print head until positional offsets for the plurality of alignment marks are all equal within a specified tolerance, wherein the positional offset for each of the plurality of alignment marks comprises an offset between an actual location and a predefined reference location for the alignment mark;
- measuring an actual location for each of the plurality of alignment marks;
- averaging the actual locations for each of the plurality of alignment marks to determine an alignment reference point location;
- calculating an actual origin location for the liftoff pattern by applying a predetermined offset to the alignment reference point location;
- calculating a translation vector from an offset between the actual origin location and a predetermined design origin location for the base layer; and
- utilizing the translation vector to align the liftoff pattern with the base layer.

9. A method for etching a base pattern into a base layer, the method comprising:
- printing a liftoff pattern on the base layer;
- forming a blanket layer over the base layer, a first portion of the blanket layer being formed on the liftoff pattern;
- removing the liftoff pattern and the first portion of the blanket layer to create a patterned blanket layer; and
- etching the base layer using the patterned blanket layer as an etch mask to create the base pattern,
- wherein printing the liftoff pattern comprises:
- printing a first printed element having a first width; and
- printing a second printed element having a second width,
- wherein a distance between a first edge of the first printed element and a second edge of the second printed element is less than the first width and the second width.

* * * * *

UNITED STATES PATENT AND TRADEMARK OFFICE
CERTIFICATE OF CORRECTION

| | |
|---|---|
| PATENT NO. | : 7,309,563 B2 |
| APPLICATION NO. | : 10/741252 |
| DATED | : December 18, 2007 |
| INVENTOR(S) | : Kateri E. Paul et al. |

Page 1 of 1

It is certified that error appears in the above-identified patent and that said Letters Patent is hereby corrected as shown below:

In the Specifications:

Column 1, line 5, please delete "70NANBOH3033" and insert --70NANB0H3033--.

Signed and Sealed this
Third Day of September, 2013

Teresa Stanek Rea
*Acting Director of the United States Patent and Trademark Office*